United States Patent
Ivanov

(10) Patent No.: US 9,953,866 B1
(45) Date of Patent: Apr. 24, 2018

(54) METHODS FOR FORMING A BARRIER LAYER WITH PERIODIC CONCENTRATIONS OF ELEMENTS AND STRUCTURES RESULTING THEREFORM

(71) Applicant: Lam Research Corporation, Fremont, CA (US)

(72) Inventor: Igor C. Ivanov, Dublin, CA (US)

(73) Assignee: Lam Research Corporation, Fremont, CA (US)

( * ) Notice: Subject to any disclaimer, the term of this patent is extended or adjusted under 35 U.S.C. 154(b) by 389 days.

(21) Appl. No.: 14/080,257

(22) Filed: Nov. 14, 2013

Related U.S. Application Data

(62) Division of application No. 12/838,643, filed on Jul. 19, 2010, now Pat. No. 8,591,985, which is a division of application No. 11/199,620, filed on Aug. 9, 2005, now abandoned.

(60) Provisional application No. 60/599,975, filed on Aug. 9, 2004.

(51) Int. Cl.
 *C23C 18/16* (2006.01)
 *H01L 21/768* (2006.01)

(52) U.S. Cl.
 CPC .... *H01L 21/76841* (2013.01); *C23C 18/1619* (2013.01)

(58) Field of Classification Search
 CPC .................................................. C23C 18/1619
 See application file for complete search history.

(56) References Cited

U.S. PATENT DOCUMENTS

| | | | |
|---|---|---|---|
| 2003/0172955 A1* | 9/2003 | Kuroda | H01L 21/67051 134/2 |
| 2004/0137161 A1* | 7/2004 | Segawa | C23C 18/1619 427/430.1 |
| 2004/0253826 A1* | 12/2004 | Ivanov | C23C 8/02 438/710 |

* cited by examiner

*Primary Examiner* — Dah-Wei D. Yuan
*Assistant Examiner* — Stephen A Kitt
(74) *Attorney, Agent, or Firm* — Beyer Law Group LLP

(57) ABSTRACT

A method is provided which includes dispensing and removing different deposition solutions during an electroless deposition process to form different sub-films of a composite layer. Another method includes forming a film by an electroless deposition process and subsequently annealing the microelectronic topography to induce diffusion of an element within the film. Yet another method includes reiterating different mechanisms of deposition growth, namely interfacial electroless reduction and chemical adsorption, from a single deposition solution to form different sub-films of a composite layer. A microelectronic topography resulting from one or more of the methods includes a film formed in contact with a structure having a bulk concentration of a first element. The film has periodic successions of regions each comprising a region with a concentration of a second element greater than a set amount and a region with a concentration of the second element less than the set amount.

10 Claims, 7 Drawing Sheets

METHODS FOR FORMING A BARRIER LAYER WITH PERIODIC CONCENTRATIONS OF ELEMENTS AND STRUCTURES RESULTING THEREFROM

CONTINUING DATA

The present application is a divisional from prior U.S. patent application Ser. No. 12/838,643 filed Jul. 19, 2010 which is a divisional from U.S. patent application Ser. No. 11/199,620 filed Aug. 9, 2005 which claims priority to U.S. Provisional Application No. 60/599,975 filed Aug. 9, 2004.

BACKGROUND OF THE INVENTION

1. Field of the Invention

This invention generally relates to methods for processing a microelectronic topography and more particularly to electroless plating processes performed upon microelectronic topographies and structures resulting therefrom.

2. Description of the Related Art

The following descriptions and examples are not admitted to be prior art by virtue of their inclusion within this section.

Electroless plating (also referred to herein as "electroless deposition") is a process for depositing materials on a catalytic surface from an electrolyte solution without an external source of current. An advantage of an electroless plating process is that it can be selective, i.e., the material can be deposited only onto areas that demonstrate appropriate chemical properties. In particular, local deposition can be performed onto metals that exhibit an affinity to the material being deposited or onto areas pretreated or pre-activated, e.g., with a catalyst. The ratio of the deposition rate on the activated regions to the deposition rate at the non-activated regions is known as the "deposition process selectivity." For many applications, it is important to provide a deposition of high selectivity. For instance, high deposition selectivity may be advantageous for the formation of metal features within integrated circuits, such as but not limited to contacts, vias, and interconnect lines.

Another important characteristic of an electroless plating process is producing a deposition profile which is commensurate with the fabrication specifications of the device. For instance, in some cases, it may be advantageous to have a film deposited with substantially uniform thickness. In cases in which a film is electrolessly deposited across a microelectronic topography, however, obtaining thickness uniformity may be difficult. In particular, some electroless plating techniques are susceptible to the "edge effect" in which portions of a film deposited near the edge of the wafer are thinner than the portions of the film deposited near the center of the wafer. Such an effect also hinders fabrication specifications for depositing films having greater thicknesses near the edge of the wafer as compared to near the center of the wafer.

As noted above, electroless plating may be used for the formation of metal features within integrated circuits. In some cases, electroless plating techniques may be particularly favorable for depositing materials into deep and/or narrow holes that cannot be uniformly covered by other deposition techniques, such as sputtering and evaporation, for example. In addition, electroless plating techniques may be advantageous for forming copper features, complementing the trend in the integrated circuit industry of employing copper metallization structures instead of aluminum, tungsten, silicides, or the like. In some microelectronic devices, a barrier layer may be arranged beneath and/or upon a metal feature to prevent elements within the metal feature from respectively diffusing to underlying and overlying layers of the topography. Such barrier layers may, in some embodiments, be formed by electroless plating processes. Although conventional barrier layers are generally sufficient to inhibit most elemental diffusion from a metal feature, some diffusion may still occur. For example, copper atoms are particularly notorious for being able to migrate through barrier layers. The migrated copper atoms can potentially be exposed to oxidation or moisture at the surface of the barrier layer or may tunnel through silicon materials disposed adjacent to the barrier layer, affecting the reliability of the device and, in some cases, causing the device to malfunction.

Therefore, it would be desirable to develop methods and systems for fabricating barrier layers which inhibit a greater degree of elemental diffusion from overlying and/or underlying metal features than provided by conventional barrier layers. In addition, it would be beneficial to develop systems and methods for electrolessly depositing films without incurring the edge effect.

SUMMARY OF THE INVENTION

The problems outlined above may be in large part addressed by methods involving electroless plating processes for the formation of metallic layers and structures within microelectronic topographies. The following are mere exemplary embodiments of the methods and resulting structures and are not to be construed in any way to limit the subject matter of the claims.

An embodiment of one of the methods includes positioning the microelectronic topography within an electroless plating chamber, dispensing a first deposition solution upon the microelectronic topography to form a first sub-film, and subsequently removing the first deposition solution from the electroless plating chamber. The method further includes dispensing a second deposition solution upon the microelectronic topography subsequent to the removal of the first deposition solution to form a second sub-film upon and in contact with the first sub-film. The second sub-film includes multiple elements included within the first sub-film.

An embodiment of another of the methods includes forming a bulk metallic film upon the microelectronic topography using an electroless plating process. The bulk metallic film includes a bottom portion, a top portion, and an intermediate portion interposed between the bottom and top portions. One of the top and bottom portions includes a higher concentration of a first element than the intermediate portion and the other of the top and bottom portions. The method further includes annealing the microelectronic topography to induce diffusion of the first element within the bulk metallic film such that the intermediate portion comprises a higher concentration of the first element than the bottom and top portions.

An embodiment of yet another of the methods includes exposing a microelectronic topography to a deposition solution and forming a first sub-film portion by interfacial electroless reduction of a first element within the deposition solution until a second different element reaches a certain concentration within the deposition solution. The first sub-film includes a higher concentration of the first element than the second element. The method further includes forming a second sub-film portion upon and in contact with the first sub-film portion by chemical adsorption until the first element increases to a particular concentration within the deposition solution. The second sub-film includes a higher concentration of the second element than the first element. In addition, the method includes reiterating the steps of forming the first and second sub-film portions to form a composite film comprising concentration variations of the first and second elements.

An embodiment of a microelectronic topography resulting from one or more of the methods includes a structure having a bulk concentration of a first element disposed throughout the structure and a film consisting essentially of one or more elements different than the first element formed in contact with the structure. The film has periodic successions of regions each comprising at least one region with a concentration of a second element greater than a set amount and at least one region with a concentration of the second element less than the set amount.

Another embodiment of a microelectronic topography resulting from one or more of the methods includes a conductive structure having a bulk concentration of copper disposed throughout the structure and a film formed in contact with the conductive structure comprising alternating regions of comparatively greater and lesser concentrations of cobalt.

BRIEF DESCRIPTION OF THE DRAWINGS

Other objects and advantages of the invention will become apparent upon reading the following detailed description and upon reference to the accompanying drawings in which.

Figure 1:
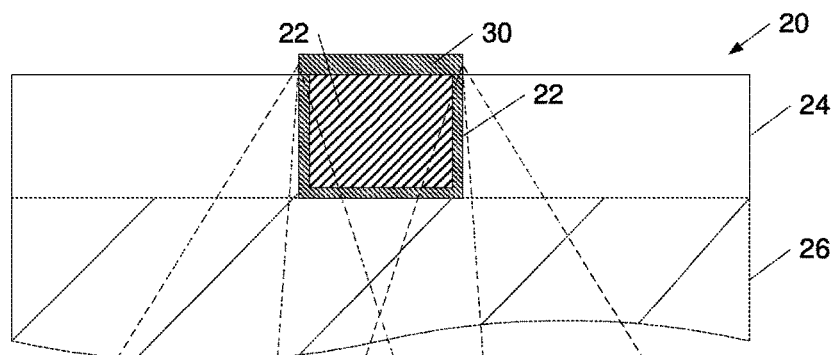
FIG. 1 depicts a partial cross-sectional view of a microelectronic topography having a liner layer and cap layer formed about a metallization structure.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning to the drawings, exemplary methods and systems involving electroless plating processes for the formation of metallic layers and structures within microelectronic topographies are shown. In addition, microelectronic topographies resulting from the use of such methods and systems are shown. For instance, FIG. 1 illustrates a partial cross-sectional view of microelectronic topography 20 having liner layer 28, cap layer 30, as well as other metallic structures which may be formed from the methods and systems described below in reference to FIGS. 3-13. Although the methods and systems described below are specifically discussed in reference to the formation of barrier layers and, therefore, are specific to liner layer 28 and cap layer 30, any of the metallic structures of microelectronic topography 20, including those formed below lower layer 26 and those formed above cap layer 30, may be formed by the methods and systems described below in reference to FIGS. 3-13.

Figure 2A:
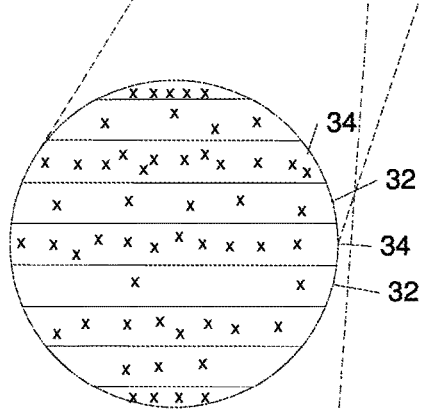
FIG. 2a depicts an exemplary view of at least one of the liner layer and cap layer illustrated in FIG. 1, which may serve as a partial cross-sectional view or a partial plan view.
Figure 2B:
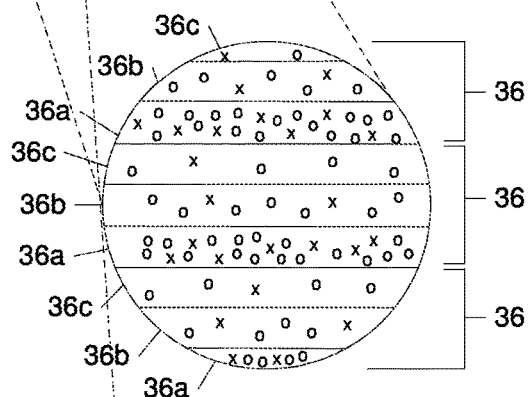
FIG. 2b depicts another exemplary view of at least one of the liner layer and cap layer illustrated in FIG. 1, which may serve as a partial cross-sectional view or a partial plan view.
Figure 2C:
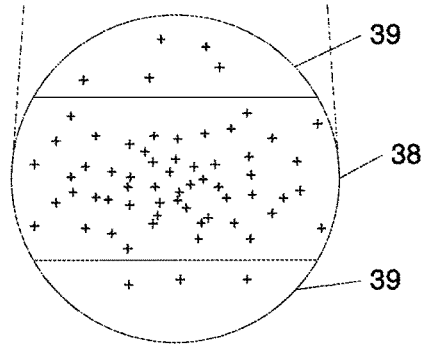
FIG. 2c depicts yet another exemplary view of at least one of the liner layer and cap layer illustrated in FIG. 1, which may serve as a partial cross-sectional view or a partial plan view.

As will be described in more detail below, the elemental composition of liner layer 28 and cap layer 30 may be configured to reduce the diffusion of elements from metallization structure 22 to lower layer 26, dielectric layer 24 and any layers formed upon cap layer 30, reducing electromigration within an ensuing device. In addition, cap layer 30 may be configured to prevent oxidation of metallization structure 22. As such, liner layer 28 and cap layer 30 may generally be referred to as barrier layers. Such a reference, however, does not necessarily infer the exclusivity of the aforementioned functions. In particular, liner layer 28 and/or cap layer 30 may additionally or alternatively serve as adhesion layers and/or thermal expansion buffers. Exemplary elemental compositions of liner layer 28 and/or cap layer 30 resulting from the use of the methods and/or systems described in reference to FIGS. 3-13 are shown in FIGS. 2a-2c and are discussed in more detail below. It is noted that microelectronic topography 20 is not necessarily limited to having both liner layer 28 and cap layer 30 be formed by the methods and systems described herein. In particular, the methods and systems may be applied to either or both of such layers. In addition, although microelectronic topography 20 is shown including both liner layer 28 and cap layer 30, the topography is not necessarily so limited. In particular, microelectronic topography 20 may alternatively include only one of liner layer 28 and cap layer 30.

In general, the term "microelectronic topography" may refer to a substrate resulting from or used for the fabrication of a microelectronic device or circuit, such as an integrated circuit, for example. As such, metallization structure 22 may be any metal feature known for the fabrication of a microelectronic device. For example, metallization structure 22 may, in some embodiments, serve as a contact structure to portions of a semiconductor layer. In such cases, lower layer 26 may include a semiconductor material, such as silicon and may, in some embodiments, be doped either n-type or p-type. More specifically, lower layer 26 may be a monocrystalline silicon substrate or an epitaxial silicon layer grown on a monocrystalline silicon substrate. In addition or alternatively, lower layer 26 may include a silicon on insulator (SOI) layer, which may be formed upon a silicon wafer. In other cases, lower layer 26 may include metallization and/or an interlevel dielectric layer. In such embodiments, metallization structure 22 may serve as a via, an interconnect or any other metallization feature to underlying portions of microelectronic topography 20.

In any case, metallization structure 22 may include one or more layers of conductive materials, including but not limited to copper, aluminum, tungsten, titanium, silver, or any alloy of such metals. In some embodiments, the methods and systems described herein may be particularly applicable to microelectronic topographies including a metallization structure having a bulk concentration of copper and, in some cases, consisting essentially of copper. In particular, copper has a relatively low resistivity and, therefore, is often favorable to use for metallization structures in microelectronic devices. As noted above, copper atoms are particularly notorious for their propensity to diffuse through materials. The methods and systems described herein, however, offer manners in which to fabricate barrier layers around copper metallization structures to substantially minimize or eliminate the diffusion of copper to other layers.

In some embodiments, metallization structure 22 may, in some embodiments, be fabricated by electroless plating techniques, including those described herein as well as others known in the microelectronic fabrication industry. In other embodiments, metallization structure 22 may be formed by other deposition techniques known in the microelectronic fabrication industry, such as but not limited to sputtering or evaporation. In either case, metallization structure 22 may be formed within a trench formed within dielectric layer 24. Such a fabrication sequence may be particularly advantageous for the incorporation of liner layer 22 within microelectronic topography 20. In other embodiments, dielectric layer 24 may be formed subsequent to and about metallization structure 22.

Dielectric layer 24 may include one or more of various dielectric materials used in microelectronic fabrication. For example, dielectric layer 24 may include silicon dioxide ($SiO_2$), silicon nitride ($Si_xN_y$), silicon dioxide/silicon nitride/silicon dioxide (ONO), silicon carbide, carbon-doped $SiO_2$, or carbonated polymers. In some cases, dielectric layer 24 may be undoped. Alternatively, dielectric layer 24 may be doped to form, for example, low doped borophosphorus silicate glass (BPSG), low doped phosphorus silicate glass (PSG), or fluorinated silicate glass (FSG). In some embodiments, dielectric layer 24 may be formed from a low-permittivity ("low-k") dielectric, generally known in the art as a dielectric having a dielectric constant of less than about 3.5. One low-k dielectric in current use, which is believed to make a conformal film, is fluorine-doped silicon dioxide. In any case, dielectric layer 24 may have a thickness between approximately 2,000 angstroms and approximately 10,000 angstroms. Larger or smaller thicknesses of dielectric layer 24, however, may be appropriate depending on the microelectronic device being formed.

As noted above, the elemental composition of liner layer 28 and cap layer 30 may be configured to reduce the diffusion of elements from metallization structure 22. As such, the selection and arrangement of the elements included within liner layer 28 and cap layer 30 may, in some embodiments, depend on the elements included in metallization structure 22. In embodiments in which metallization structure 22 includes copper, the inclusion of cobalt within liner layer 28 and cap layer 30 may be particularly beneficial since copper has relatively low solubility with cobalt. Other materials which may be additionally or alternatively included within liner layer 28 and cap layer 30 may include phosphorus, boron, tungsten, chromium, molybdenum, nickel, palladium, rhodium, ruthenium, oxygen, and hydrogen.

Exemplary alloys which may be employed for liner layer 28 and cap layer 30 include but are not limited to cobalt-tungsten-phosphorus (CoWP), cobalt-tungsten-boron (CoWB), cobalt-tungsten-phosphorus-boron (CoWPB), cobalt-molybdenum-boron (CoMoB), cobalt-molybdenum-phosphorus (CoMoP), cobalt-molybdenum-chromium (CoMoCr), and cobalt-molybdenum-chromium-boron (CoMoCrB). In other embodiments, liner layer 28 and/or cap layer 30 may include single element layers of palladium, rhodium and ruthenium. It is noted that although hydrogen is not listed as an element with such exemplary materials, it may be incorporated therein as a result of the electroless plating process as described in more detail below. In some embodiments, liner layer 28 and cap layer 30 may include the same collection of elements and, in some cases, a similar arrangement of elements. In other cases, however, liner layer 28 and cap layer 30 may include different arrangements of elements and, in some embodiments, a different collection of elements.

In some embodiments, liner layer 28 and/or cap layer 30 may include a variation of elemental concentrations throughout the layers to reduce the diffusion of elements from metallization structure 22 therethrough. In particular, liner layer 28 and/or cap layer 30 may include different concentrations of elements in different regions of the layer. Exemplary elemental compositions of liner layer 28 and/or cap layer 30 are shown in FIGS. 2a-2c. In some cases, the variation of elements within liner layer 28 and cap layer 30 may be arranged in sub-layers vertically disposed within the films. As such, FIGS. 2a-2c may, in some embodiments, illustrate partial cross-sectional views of liner layer 28 and/or cap layer 30. In other cases, the variation of elements may be additionally or alternatively arranged in regions extending horizontally between lateral edges of the films. As such, FIGS. 2a-2c may alternatively illustrate partial plan views of the upper surface of cap layer 30. In such embodiments, liner layer 28 may, in some cases, include a similar horizontal variation of elements and, therefore, FIGS. 2a-2c may apply to liner layer 28 for horizontal variations of elements as well. In some cases, the variation of element concentrations may vary both horizontally and vertically within the films and, therefore, FIGS. 2a-2c may be representative of either a cross-sectional view or a plan view of the layers.

As shown in FIG. 2a, liner layer 28 and/or cap layer 30 may, in some embodiments, include alternating regions of comparatively greater and lesser concentrations of an element. More specifically, FIG. 2a illustrates an arrangement of atoms of an element (each atom shown as an "x" in FIG. 2a) which, in an effect, partitions the layer into regions 32 comprising comparatively fewer atoms of the element and regions 34 comprising comparatively greater quantities of atoms of the element. Regions 32 and 34 are disposed along opposing sides of each other and, therefore, alternative through the film. Regions 32 and regions 34 may be differentiated from each other by including concentrations of an element which respectively fit into different ranges of concentrations. For example, in some embodiments, regions 32 may include between approximately 30% and approximately 50% of an element, while regions 34 may include between approximately 5% and approximately 20% of an element. Larger or smaller ranges and magnitudes of elemental concentrations may be employed depending on the element of differing concentration and the design specifications of the device. Consequently, the barrier films disclosed herein are not necessarily limited to the aforementioned values. Since regions 32 and regions 34 are differentiated by different ranges of elemental concentrations, neither regions 32 nor regions 34 need to necessarily include the same concentrations of an element as shown in FIG. 2a. Noting such a scope of the film, the elemental concentrations of regions 32 and 34 are not necessarily restricted to having different elemental concentrations either. Therefore, in some cases, two or more of the respective regions may include the same elemental concentration.

It is noted that elemental atoms other than the one shown in FIG. 2a may be included within liner layer 28 and cap layer 30. In addition, although FIG. 2a illustrates variation of only a single element within liner layer 28 and cap layer 30, other elements within the film may vary. In some embodiments, the other elements may vary in a similar manner as element x and, therefore, may be disposed within regions 34 and 32 having comparatively greater and lesser concentrations, respectively. In other embodiments, regions 32 and 34 may include an opposite arrangement of greater and lesser concentrations of the one or more elements. In particular, regions 32 may include a low concentration of element x and a high concentration of another element and vice versa for regions 34. In yet other embodiments, the concentration variation of the other element may not alternate through the film, but may follow its own succession of regions having varying concentrations of the element. In any case, regions 32 and 34 are not restricted to having the same concentration levels of different elemental atoms. In particular, regions 32 and 34 may include different ranges of concentrations for each element. Alternatively, the concentration of other elements may not substantially vary through the film.

An alternative arrangement of elements for liner layer 28 and cap layer 30 is illustrated in FIG. 2b. In particular, FIG. 2b illustrates liner layer 28 and cap layer 30 having concentration variations of two different elements (atoms of the elements shown as "x" and "o"). As shown in FIG. 2b, the relative concentrations of the elements do not alternate through the films, but rather are disposed as periodic successions of regions 36. More specifically, periodic successions of regions 36 are shown having three regions with relatively different concentrations of element atoms "x" and "o." Although periodic successions of regions 36 are shown to include three regions, liner layer 28 and cap layer 30 are not necessarily so restricted. In particular, periodic successions of regions 36 may include any plurality of regions.

Each of periodic successions of regions 36 includes at least one region with a concentration of an element greater than a set amount and at least one region with a concentration of the element less than the set amount. The set amounts may generally depend on the individual element and the design specifications of the film and, therefore, may vary between approximately 1% and approximately 99%. Set amounts for the multiple elements within a film are generally independent of each other. As shown in FIG. 2b, periodic successions of regions 36 may include region 36a having a greater concentration of elemental atoms "x" and "o" than region 36b, which includes a greater concentration than region 36c. In such cases, region 36a may include a concentration of elemental atoms "x" and "o" greater than a set amount and region 36c may include a concentration of elemental atoms "x" and "o" less than the set amount. Region 36b may fit into either of such categories, depending on the design specifications of the film. As such, periodic successions of regions 36 may include a series of regions having incrementally increasing relative concentrations. In other embodiments, regions 36a, 36b, and 36c may be arranged in an alternative sequence, such as having regions 36a or 36c interposed between the other regions such that progression of elemental concentrations through periodic successions of regions 36 is not incremental.

In any case, periodic successions of regions 36 may include regions which are differentiated from each other by respectively different ranges of elemental concentrations. As such, each of regions 36a (as well as each of regions 36b and 36c) do not necessarily need to include the same concentrations of elemental atoms "x" or "o." Furthermore, periodic successions of regions 36 are not restricted to having the same concentration levels of element atoms "x" and "o." In particular, regions 36a, 36b and 36c may include different ranges of concentrations for each element. Moreover, the relative level of elemental concentrations among regions 36a, 36b, and 36c may be different for each of the elements respectively associated with atoms "x" and "o." For example, region 36a may alternatively include the relatively highest amount of elemental atoms "x" and include the relatively lowest amount of elemental atoms "o" among each succession of regions 36. In other embodiments, region 36b or 36c may alternatively include the relatively highest amount of elemental atoms "x" and the relatively lowest amount of elemental atoms "o" among each succession of regions 36.

Another alternative composition of elements for liner layer 28 and/or cap layer 30 is illustrated in FIG. 2c. In particular, FIG. 2c illustrates liner layer 28 and/or cap layer 30 including region 38 with a relatively high concentration of element "+" interposed between regions 39 having comparatively lower concentrations of the element. As described in more detail below, such an arrangement may be resultant of the method described below in reference to FIG. 4, although it is not necessarily limited to such a method of formation. As with regions 32 and 34 of FIG. 2a, regions 39 do not necessarily need to include the same concentration of element "+." Rather, regions 39 may include concentrations of an element which fits into a different range of concentrations than the concentration of region 38. In addition, region 38 is not restricted to being centered within liner layer 28 and cap layer 30.

It is noted that liner layer 28 and cap layer 30 are not necessarily restricted to the configurations illustrated in FIGS. 2a-2c. In particular, liner layer 28 and cap layer 30 may include any variation of elemental concentrations among distinct regions of the films. In some embodiments, it may be particularly advantageous for at least one of liner layer 28 and cap layer 30 to include a periodic arrangement of concentration levels in order to inhibit diffusion from metallization structure 22. In particular, liner layer 28 and/or cap layer 30 may include different concentrations of one or more elements at regular intervals of the layer as shown in FIGS. 2a and 2b, for example. In other embodiments, the variation of elemental concentration shown in FIG. 2c may be appropriate to inhibit diffusion from metallization structure 22.

In general, the elements which are configured to vary within liner layer 28 and/or cap layer 30 may be any of the elements which may be included within the films. In particular, the elements having varying concentrations in liner layer 28 and cap layer 30 may be cobalt, phosphorus, boron, tungsten, chromium, molybdenum, nickel, palladium, rhodium, ruthenium and/or hydrogen. As noted above, copper has relatively low solubility with cobalt and, therefore, it may be advantageous to vary the concentration of cobalt within liner layer 28 and/or cap layer 30 in some embodiments. In particular, a variation of cobalt concentration throughout liner layer 28 and cap layer 30 may substantially reduce the migration of copper through the films compared to embodiments in which the concentration of cobalt is substantially even. In turn, the likelihood of copper atoms reaching surrounding layers may be reduced. In some cases, the level of cobalt concentration may alternate through liner layer 28 and cap layer 30. Consequently, in some cases, liner layer 28 and cap layer 30 may include a composite film of alternating cobalt-rich and cobalt-poor regions.

In any case, it may be further advantageous to include a relatively high concentration of cobalt in regions of liner layer 28 and/or cap layer 30 directly adjacent and in contact with metallization structure 22 to improve the adhesion to the copper material. Such an arrangement, however, is not necessarily required and, therefore, microelectronic topography 20 is not intended to be restricted to such a configuration. As noted above, liner layer 28 and cap layer 30 may include periodic regions of different concentrations of other elements as well or alternatively. It is noted that the variation of symbols denoting different elemental atoms in FIGS. 2a-2c (i.e., "x," "o," and "+") do not necessarily imply that the different configurations are particular to specific elements or combinations of elements. The differentiation is merely shown to emphasize that different elements may be formed in a periodic manner within barrier layers.

Although variations of elemental concentrations within liner layer 28 and cap layer 30 may differ depending on the design specifications of microelectronic topography 20, some exemplary ranges may be applicable to many applications. For instance, an exemplary cobalt concentration variation may be between, for example, approximately 10% and approximately 30%, or more specifically, a variation of approximately 20%. In addition, an exemplary variation of phosphorus concentration may be between approximately 3% and approximately 12% and a variation of boron concentration may be between approximately 1% and approximately 2%. In some cases, liner layer 28 and cap layer 30 may include a concentration variation of molybdenum between approximately 1% and approximately 50%. Larger or smaller variations of concentrations may be employed for any of such elements as well as the other elements listed for liner layer 28 and cap layer 30 and, therefore, the aforementioned limitations do not necessarily limit the range of elemental concentrations within the layers.

Figure 3:
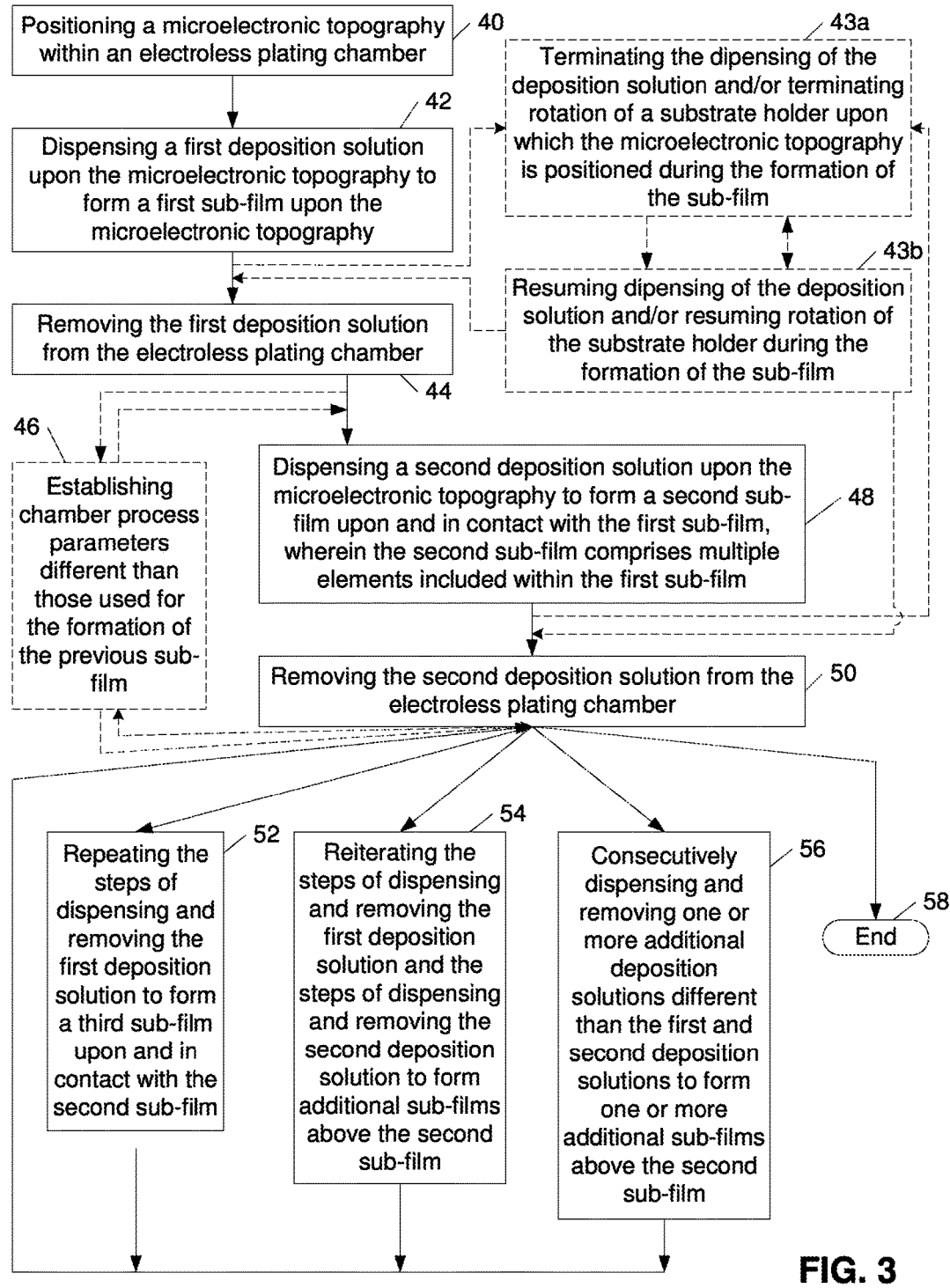
FIG. 3 depicts a flowchart of a method for forming a composite metallic layer having a variation of elemental concentrations.

Several methods are described herein for forming a barrier layer (such as liner layer 28 and/or cap layer 30) with a variation of the components. For example, one method for forming a barrier layer with a vertical variation of elemental concentrations may include depositing a plurality of sub-layers having different concentrations of elements. A flow-chart of a method of depositing a plurality of sub-layers having different concentrations of elements is shown in FIG. 3. As shown in blocks 40 and 42 of FIG. 3, the method may include positioning a microelectronic topography within an electroless plating chamber and dispensing a first deposition solution upon the microelectronic topography to form a first sub-layer upon the microelectronic topography. In some embodiments, the process may further include rotating a substrate holder upon which the microelectronic topography is positioned to facilitate the distribution of the first deposition solution across the topography. The first sub-layer may include one or more elements formed within individual concentration ranges.

In some embodiments, the distribution of the first deposition solution may be a single continuous flow across the surface of microelectronic topography. In other embodiments, the distribution of the first deposition solution may be a series of fragmented depositions of the solution at different locations extending different distances from a center of the microelectronic topography. Such a technique may induce a horizontal variation of element concentrations within the first sub-layer and, in some cases, subsequent sub-films. Consequently, the ensuing composite layer may include both vertical and horizontal variations of elemental concentrations. An exemplary method and system for dispensing deposition solution in a series of fragmented times and locations are described in more detail below in reference to FIGS. 6-8. In some cases, the method may additionally or alternatively be performed in a chamber configured to induce a variation of evaporation rates across a topography such that a horizontal variation of elemental concentrations within the first and/or subsequent sub-films may be obtained by such a manner. An exemplary method and system for varying evaporation rates across a microelectronic topography during an electroless deposition chamber are described in more detail below in reference to FIGS. 12 and 13.

In any case, the method may, in some embodiments, include blocks 43a and 43b in which dispensing the deposition solution and/or rotation of the substrate holder (when so applied) is terminated and subsequently resumed during the deposition of the first sub-film. In some embodiments, the processes associated with blocks 43a and 43b may be conducted as a single sequence of steps as indicated by the single direction arrow between the blocks. In other cases, the processes associated with blocks 43a and 43b may be reiterated multiple times during the deposition process as indicted by the bi-directional arrow between the blocks. In such embodiments, the sequence of steps may end with either of the processes when the method continues onto block 44 even though FIG. 1 illustrates the method continuing on to block 44 from block 43*b*. In either case, the sequence of steps may advantageously facilitate a substantial uniform deposition of elemental components across the topography within the first sub-film while still preventing the accumulation of bubbles upon the topography during deposition, as described in more detail below. The sequence of steps may additionally or alternatively be used during the deposition of subsequent sub-films as well. As such, although the overall method described in reference to FIG. 3 is used to fabricate a composite barrier layer with a variation of elemental concentrations (i.e., among the different sub-films), the sub-film layers themselves may be formed to have a substantially uniform distribution and concentration of elements.

It is theorized that the adsorption potential of charged molecules within a deposition solution is influenced by the ratio of different surface materials (e.g., amount of conductive surfaces versus dielectric surfaces) within a given area of a topography. In particular, it is theorized that an area with a greater density of conductive structures (i.e., an area with relatively less dielectric surface material) may have a stronger affinity for adsorbing charged molecules than an area of relatively lower density of conductive structures. As a result, the area with the greater density of conductive structures may have a different concentration and distribution of elements than the area with the lesser density of conductive structures. It has been discovered, in conjunction with the development of the methods described herein, that the termination of dispensing the deposition solution and/or the termination of rotating the substrate holder during the deposition of a film may reduce or negate variations of charged molecule adsorption potentials relative to areas of a topography having different densities of surface materials. In particular, it has been found that the termination of one or more of the processes associated with block 43*a* allows films having substantially similar distribution and concentration of elements to be deposited across a topography.

In some cases, however, the termination processes of block 43*a* may cause the formation of bubbles upon the microelectronic topography. The formation of bubbles during electroless deposition processes often cause undesirable random non-uniformity in deposition thickness and, in some cases, cause defects to be formed within the film. The recommencement of dispensing the deposition solution and/or rotating the substrate holder as noted in block 43*b*, however, may advantageously remove bubbles formed from the termination processes. As a result, a film having a substantially uniform elemental composition, uniform thickness, a minimal number or no defects may be deposited with the technique described herein.

In general, the duration of termination and resumption of the processes described in reference to FIGS. 43*a* and 43*b* may be between approximately 0.5 seconds and approximately 1 minute. Shorter or longer durations, however, may be employed for each of such processes. In some embodiments, it may be advantageous for the termination of the processes to be short, such as between approximately 0.5 seconds and approximately 5 seconds, or more specifically about 2 seconds, to reduce the formation of bubbles during the deposition process. In some cases, it may be beneficial for the termination of the processes to be shorter than the duration for which the processes are resumed. For example, in some embodiments, it may be advantageous to resume the processes for a duration between approximately 15 seconds and approximately 45 seconds, or more specifically about 30 seconds. In other cases, however, the duration of the processes may be the same or the termination of the processes may be longer than the duration for resuming the processes. In yet other embodiments, blocks 43*a* and 43*b* and the associated termination and resuming processes may be omitted from the method described in reference to FIG. 3. Blocks 43*a* and 43*b* and the arrows extending to and from it are outlined with dotted lines indicating the steps are optional.

In any case, the method may continue by removing the first deposition solution from the electroless plating chamber and subsequently dispensing a second deposition solution upon the microelectronic topography to form second sub-layer upon and in contact with the first sub-layer as respectively noted by blocks 44 and 48 in FIG. 3. As with the formation of the first sub-layer, the disbursement of the second deposition solution may be a single continuous flow or may be a series of fragmented depositions. In addition, the method may, in some embodiments, continue to blocks 43*a* and 43*b* such that the deposition of the second sub-film includes the termination of dispensing the deposition solution and/or the termination of rotating the substrate holder as similarly described above for the formation of the first sub-film.

In any case, the second sub-layer may include multiple elements which are also included within the first sub-layer. In some embodiments, the second sub-layer may consist essentially of the same elements as included in the first sub-layer. In other embodiments, however, the first and second sub-layer may include some different elements. In any case, the second sub-layer may include one or more elements having concentrations within different ranges than employed within the first sub-layer. In other words, a concentration of at least one of the elements within the second sub-layer may differ from a concentration of the same element within the first sub-layer. In this manner, the method induces a vertical variation of elemental concentrations.

As shown in FIG. 3, the method may, in some embodiments, include block 46 in which chamber process parameters different than those used for the formation of the previous sub-film are established. The incorporation of block 46 prior to the formation of the second sub-layer, as shown in FIG. 3, may in turn include establishing chamber process parameters different than those used during the formation of the first sub-layer. Such different process parameters may be wholly or partially responsible for the variations of elemental concentrations between the first and second sub-layers. In particular, the change in parameters by which the electroless deposition process is conducted may be sufficient to affect the concentration of elements within the second sub-layer as compared to the first sub-layer. Such influential process parameters may include but are not limited to temperature, pressure, and the type of ambient gas included within the electroless plating chamber.

In some embodiments, the first and second depositions solutions may include the same compositions and, therefore, the changes of chamber process parameters may be wholly responsible for the variations of elemental concentrations between the first and second sub-layers. In other embodiments, the first and second depositions solutions may include different compositions and, therefore, the changes of chamber process parameters may be partially responsible for the variations of elemental concentrations between the first and second sub-layers. In yet other embodiments, block 46 may not be employed prior to the formation of the second sub-layer. In such cases, the variation of compositions among the first and second deposition solutions may be wholly responsible for the variation of elemental concentrations between the first and second sub-layers. Block 46 and the arrows extending to and from it are outlined with dotted lines indicating the step is optional and, therefore, block 46 and the associated establishment of different chamber process parameters may be omitted in some cases.

Regardless of whether different chamber process parameters are established prior to the formation of the second sub-layer, the second deposition solution may be removed from the electroless plating chamber subsequent to the formation of the second sub-layer as shown by block 50 in FIG. 3. Thereafter, the method may follow several different routes. In particular, the method may, in some embodiments, end at block 58 after the removal of the second deposition solution from the electroless plating chamber. Alternatively, the method may include repeating the steps of dispensing and removing the first deposition solution (described in reference to block 42 and 44) to form a third sub-layer upon and in contact with the second sub-layer as shown by block 52 in FIG. 3. As with the second sub-layer, the third sub-layer may include a multiple of the same elements included within the first sub-layer. In addition, the method may, in some embodiments, continue to blocks 43a and 43b such that the deposition of the third sub-film includes the termination of dispensing the deposition solution and/or the termination of rotating the substrate holder as similarly described above for the formation of the first sub-film.

In some cases, the third sub-layer may consist essentially of the same elements as included in the first sub-layer. In other embodiments, however, the first and third sub-layers may include some different elements. In either case, the third sub-layer may, in some embodiments, include a concentration of at least one element which is closer to a concentration of the same element with the first sub-layer than a concentration of the same element within the second sub-layer. In particular, the third sub-layer may include one or more elements having concentrations within the same ranges as employed within the first sub-layer. In this manner, the method may induce a periodic variation of an element concentration similar to but not limited to the configurations described in reference to FIGS. 2a and 2c. In other embodiments, the third sub-layer may include a substantially different concentration of an element included within the first and second sub-layers and, therefore, may be similar to the configuration described in reference to FIG. 2b.

Following an alternative route, the method may include reiterating the steps of dispensing and removing the first deposition solution (described in reference to block 42 and 44) and the steps of dispensing and removing the second deposition solution (described in reference to block 48 and 50) to form additional sub-layers above the second sub-layer as shown in block 54 of FIG. 3. In addition or alternatively, the method may include consecutively dispensing and removing one or more additional deposition solutions different than the first and second deposition solutions to form one or more additional sub-layers above the second sub-layer as noted in block 56. In either case, the additional films may be configured to induce a periodic variation of an elemental concentration with the first and second sub-films similar to but not limited to the configurations described in reference to FIGS. 2a-2c.

In addition, the processes embodied by blocks 54 and 56 may be repeated any number of times to form the composite barrier layer. For example, the processes may be repeated to form up to approximately 100 sub-film layers. In some embodiments, a composite barrier layer of less than five sub-films may be advantageous to minimize the thickness of the ensuing barrier layer, but is not necessarily limited for such reasons. The thickness of each sub-film formed by the method described in FIG. 3 may be between approximately 0.5 nm and approximately 100 nm, or more specifically between approximately 0.5 nm and approximately 50 nm. Sub-films with larger or smaller thicknesses, however, may be used to form the composite barrier layer described herein. It is noted that the method may, in some embodiments, continue to blocks 43a and 43b for any number of the sub-films formed by blocks 54 and 56 and, therefore, the deposition of such sub-films may, in some embodiments, include the termination of dispensing the deposition solution and/or the termination of rotating the substrate holder as similarly described above for the formation of the first sub-film.

As shown by the dotted lines to block 46 after the progression of steps through block 50 in FIG. 3, the method may sometimes include establishing chamber process parameters different than those used for the formation of the previous sub-layer after the removal of the second deposition solution. In particular, FIG. 3 shows that the method may, in some embodiments, include block 46 subsequent to block 50 and prior to any of blocks 52, 54, 56 or 58. The incorporation of block 46 subsequent to the formation of the second sub-layer thus may include establishing chamber process parameters different than those used during the formation of the second sub-layer. In some embodiments, the chamber process parameters may further be different from the chamber process parameters used during the formation of the first sub-layer. In such cases, the sub-layer formed upon the second sub-layer may include different elemental concentrations than the first and second sub-layers. In yet other embodiments, the chamber process parameters may be substantially similar to the parameters used during the formation of the first sub-layer such that a composite barrier layer having alternating regions of comparatively greater and lesser concentrations of one or more elements may be formed.

As with the optional modification of chamber process parameters prior to the formation of the second sub-layer discussed above, the change of process parameters prior to the formation of additional sub-layers above the second sub-layer may be wholly or partially responsible for the variations of elemental concentrations between the additional sub-layers and the second sub-layer. As such, deposition solutions dispensed upon the microelectronic topography subsequent to the removal of the second deposition solution may include the same or different elemental compositions as the first and second deposition solutions. It is further noted that block 46 may be incorporated into the method directly prior to one or more of the individual additional sub-films referenced with respect to blocks 54 and 56. Reference arrows indicating such possibilities have been omitted from FIG. 3 to simplify the drawing.

In general, the process parameters for the deposition of the sub-films with respect to the method depicted in FIG. 3 (as well as the other methods described herein) may depend on the design specifications of the sub-films, such as but not limited to their elemental compositions and thicknesses, for example. Some exemplary process parameters, however, may include deposition solution flows between approximately 0.5 L/min and approximately 10 L/min and, in some embodiments, approximately 2 L/min. In addition, wafer rotating speeds during deposition may be between approximately 1 rpm and approximately 100 rpm and, in some embodiments, approximately 30 rpm. In some embodiments, wafer rotation speeds during the removal of the deposition solutions may be faster, such as between approximately 150 rpm and approximately 2000 rpm and, in some cases, approximately 300 rpm. In this manner, the processing time between deposition cycles may be minimized. For example, in some embodiments, the processing time between deposition cycles may be approximately 5 seconds. The process time to deposit the sub-films, on the other hand, may be between approximately 10 seconds and a few minutes, and more specifically, between approximately 10 seconds and approximately 30 seconds. Furthermore, the temperature at which the electroless deposition process occurs may be between approximately 20° C. and approximately 120° C., or more specifically, between approximately 55° C. and approximately 90° C. In general, larger or smaller temperatures and slower and/or faster deposition flows, wafer rotation speeds, and process cycles times may be used to form the composite barrier layer and, therefore, the methods described herein are not necessarily limited to the aforementioned values.

Tables 1 and 2 below outline exemplary compositions of deposition solutions and chamber process parameters associated with the methods described herein, particularly in reference to FIG. 3 but not necessarily so limited. In particular, Tables 1 and 2 outline exemplary compositions of deposition solutions and chamber process parameters for depositing sub-films of a composite barrier layer with a vertical variation, and in some embodiments a horizontal variation, of elemental concentrations. More specifically, Table 1 displays exemplary compositions of deposition solutions and chamber process parameters used to form sub-films of cobalt-tungsten-phosphorus (CoWP), cobalt-tungsten-phosphorus-boron (CoWPB), cobalt-molybdenum-phosphorus (CoMoP), cobalt-molybdenum-phosphorus (CoMoP), and cobalt-molybdenum-chromium-boron (CoMoCrB). Table 2, on the other hand, displays exemplary compositions of deposition solutions and chamber process parameters used to form sub-films of some of such cobalt alloys with relatively high concentrations of W and Mo, such as greater than approximately 25%, for example. Table 2 also displays exemplary compositions of deposition solutions and process parameters used to form ruthenium (Ru) sub-films.

TABLE 1

Exemplary Compositions of Deposition Solutions and Chamber Process Parameters used to form Films of CoWP, CoWPB, CoWB, CoMoB and CoMoCrB

| Compound | CoWP | CoWPB | CoWB | CoMoB | CoMoCrB |
|---|---|---|---|---|---|
| Cobalt sulfate heptahydrate | 18 g/L | 18 g/L | 9-28 g/L | 3-26 g/L | 3-26 g/L |
| Dimethylamine borane | | 0.6 g/L | 0.8-6.0 g/L | 0.6-6.0 g/L | 0.6-6.0 g/L |
| Hypophosphorous acid | 8 g/L | 14 g/L | | | |
| Citric acid monohydrate | 57 g/L | 57 g/L | 42-84 g/L | 28-84 g/L | 28-84 g/L |
| Pyrophosphoric acid | | | | 0-35.6 g/L | 0-35.6 g/L |
| Tungsten (VI) oxide | 6 g/L | 17 g/L | 4-17 g/L | | |
| Molybdenum (VI) oxide | | | | 0.01-0.45 g/L | 0.01-0.45 g/L |
| Chromium (III) chloride hexahydrate | | | | | 0.001-5.0 g/L |
| Boric acid | 24 g/L | 16 g/L | 0-31 g/L | 0-31 g/L | 0-31 g/L |
| TMAH | pH up to 9.4 | pH up to 9.4 | pH 9.0-9.5 | pH = 8.8-9.5 | pH = 8.8-9.5 |
| Maleic acid | | | 0-1.5 g/L | 0-1.5 g/L | 0-1.5 g/L |
| HEDTA | | | 0-2.0 g/L | 0-2.0 g/L | 0-2.0 g/L |
| Temperature | 90° C. | 90° C. | >70° C. | >65° C. | >65° C. |
| Surfactant | PPG, RE-610 | PPG, RE-610 | PPG, RE-610, Triton X-100 | PPG, RE-610, Triton X-100 | PPG, RE-610, Triton X-100 |
| Deposition rate | 15-20 nm/min | 15-25 nm/min | 20-200 nm/min | | 20-250 nm/min |

PPG = poly-propylene glycol
RE-610 = GAFAC RE-610, complex phosphate esters, manufactured by GAF Corp., New York, New York
Triton X-100 = octylphenoxy polyethoxy ethanol, manufactured by Rohm and Haas, Philadelphia, Pa.

TABLE 2

Exemplary Compositions of Deposition Solutions and Chamber Process Parameters used to form Films of CoWPB, CoWB, CoMoB, CoMoCrB and Ru

| Compound | CoWPB (high W) | CoWB (high W) | CoMoB (high Mo) | CoMoCrB (high Mo) | Ru |
|---|---|---|---|---|---|
| Cobalt sulfate heptahydrate | 18 g/L | 18 g/L | 16 g/L | 16 g/L | |
| Ruthenium nitroso chloride | | | | | 2.36 g/L |
| Dimethylamine borane | 1.5 g/L | 2 g/L | 3.0 g/L | 3.0 g/L | |
| Hypophosphorous acid | 7 ml/L | | | | |
| Citric acid monohydrate | 84 g/L | 84 g/L | 63 g/L | 63 g/L | |
| Tungsten (VI) oxide | 17 g/L | 17 g/L | | | |
| Molybdenum (VI) oxide | | | 0.36 g/L | 0.36 g/L | |
| Chromium (III) chloride hexahydrate | | | | 1 g/L | |
| Boric acid | 15.5 g/L | 15.5 g/L | 15.5 g/L | 15.5 g/L | |
| NH4OH | | | | | 31 ml/L |
| Hydroxylamine sulfate | | | | | 0.75 g/L |
| Hydrazine sulfate | | | | | 23 g/L |
| Maleic acid | 0.38 g/L | | 1.5 g/L | 1.5 g/L | |

TABLE 2-continued

Exemplary Compositions of Deposition Solutions and Chamber Process
Parameters used to form Films of CoWPB, CoWB, CoMoB, CoMoCrB and Ru

| Compound | CoWPB (high W) | CoWB (high W) | CoMoB (high Mo) | CoMoCrB (high Mo) | Ru |
|---|---|---|---|---|---|
| HEDTA | 0.5 g/L | | 2.0 g/L | 2.0 g/L | |
| EDTA | | | | | 5 g/L |
| Temperature | 90° C. | >80° C. | >70° C. | >70° C. | >70° C. |
| Surfactant | PPG, RE-610 | PPG, RE-610 | PPG, RE-610 | PPG, RE-610 | |
| Deposition rate | 15-35 nm/min | 20-70 nm/min | 20-100 nm/min | 20-100 nm/min | 20-40 nm/min |

PPG = poly-propylene glycol
RE-610 = GAFAC RE-610, complex phosphate esters, manufactured by GAF Corp., New York, New York Other noble catalytic metals, such as palladium (Pd) and rhodium (Rh) as well as different combinations of the elements stated above for liner layer 28 and cap layer 30 may additionally or alternatively be formed as sub-film layers for a composite barrier layer formed from the method described in reference to FIG. 3. For example, cobalt-molybdenum-chromium (CoMoCr) may be formed as a sub-film layer of a composite barrier layer. The solution composition for the formation of a CoMoCr layer may include similar concentrations of components as described for CoMoCrB without the inclusion of dimethylamine borane. As such, the formation of a composite barrier layer described in reference to FIG. 3 is not restricted to the alloys listed in Tables 1 and 2. In addition, the compounds listed in Tables 1 and 2 may be combined for the formation of the same composite barrier layer. In particular, a compound listed in Table 2 may be formed as a sub-film over a sub-film formed from a compound listed in Table 1 or vice versa. For example, cobalt-tungsten-phosphorus having a relative high concentration of tungsten (CoWP high W) listed in Table 2 may be formed over a sub-film of CoWP listed in Table 1. In this manner, a composite barrier layer having a variation of tungsten may be formed. In yet other embodiments, any of the compounds listed in Tables 1 and/or 2 may be formed upon one another to form a composite barrier layer having a variation of elemental concentration.

Although not necessarily limited thereto, maleic acid and/or hydroxyethyl ethylenediamine triacetic acid (HEDTA) have been found to serve as effective complexing agents for the deposition of films including cobalt. Moreover, the inclusion of pyrophosphoric acid has been found to be advantageous for forming films including cobalt and molybdenum. In contrast, the inclusion of ethylenediamine triacetic acid (EDTA) has been found to be beneficial as a complexing agent for the deposition of films including ruthenium. Furthermore, the combination of ammonium hydroxide ($NH_4OH$), hydroxylamine sulfate, and hydrazine sulfate has shown to be effective for depositing films including ruthenium. It is noted that the values for such components as well as all other component values listed in Tables 1 and 2 may be altered and still be used to produce sub-films for a composite barrier layer having variations of elemental concentrations. The values listed are merely exemplary.

An alternative or additional method used to form a barrier layer having a concentration variation of one or more elements involves an anneal process which diffuses one or more elements to a particular region of the film to create additional interfaces with which to block a diffusion channel. The anneal process may be conducted after the deposition of any layer deposited by electroless plating techniques. In some embodiments, the anneal process may be performed subsequent to the method described above in reference to FIG. 3 to provide additional variation of elemental compositions within a barrier layer. In other cases, the anneal process may be performed subsequent to the methods described below in reference to FIGS. 5, 6 and 12. In yet other embodiments, the anneal process may be performed subsequent to a conventional electroless deposition process. In any case, the anneal method may be particularly advantageous for forming a barrier layer having phosphorus diffused near the middle of the film such that two additional interfaces are formed with which to block a diffusion channel such as shown in FIG. 2c, for example. The anneal process, however, may be configured to diffuse other elements in addition or alternative to phosphorus. Furthermore, the anneal process may be configured to diffuse elements in regions of the substrate other than the middle.

Figure 4:
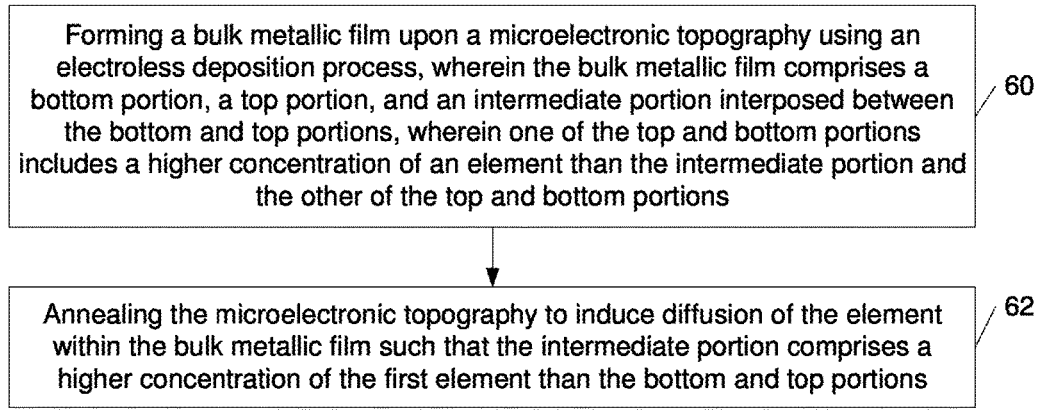
FIG. 4 depicts a flowchart of an alternative method for forming a composite metallic layer having a variation of elemental concentrations.

A flowchart of an exemplary method which incorporates a diffusing anneal process is shown in FIG. 4. In particular, FIG. 4 illustrates a flowchart including block 60 in which a bulk metallic film is formed upon a microelectronic topography using an electroless plating process. The term "bulk metallic film" may generally refer to a film having a majority concentration of metallic elements and, therefore, may refer to a barrier layer formed with a combination of any of the elements mentioned above in reference to liner layer 28 and cap layer 30 of FIG. 1. As noted in block 60 of FIG. 4, the bulk metallic film may be formed having a bottom portion, a top portion, and an intermediate portion interposed between the bottom and top portions. In some embodiments, one of the top and bottom portions may include a higher concentration of at least one element than the intermediate portion and the other of the top and bottom portions. Other variations of element concentrations, however, may be formed for the bulk metallic layer and, therefore, the method is not necessarily restricted to the arrangement of elements among the particular regions of the film recited in block 60 of FIG. 4.

In some embodiments, the bulk metallic film may be formed upon and in contact with a metallic structure having a bulk elemental concentration different than the film, such as described for cap layer 30 in FIG. 1 being arranged upon and in contact with metallization structure 22. In such cases, the bottom portion of the bulk metallic film may include a higher concentration of at least one element than the intermediate portion and the top portion. In other embodiments, the bulk metallic film may be formed upon and in contact with a dielectric structure, such as described for liner layer 28 in FIG. 1 being arranged in contact with dielectric layer 24. In such cases, the top portion of the bulk metallic film may include a higher concentration of at least one element than the intermediate portion and the bottom portion.

Following the formation of the bulk metallic film, the method continues to block 62 as shown in FIG. 4. Block 62 includes annealing the microelectronic topography to induce diffusion of at least one element within the bulk metallic film such that the intermediate portion comprises a higher concentration of the at least one element than the bottom and top portions. In general, the anneal process may include exposing a bulk metallic film to a temperature between approximately 400° C. and approximately 1000° C. for any predetermined length of time. A duration of at least approximately 10 minutes may be advantageous for ensuring diffusion of a large percentage of the element to the intermediate portion of the bulk metallic film and, in some embodiments, the anneal process may be conducted for a time period up to approximately 2 hours. In some embodiments, the heated environment to which the bulk metallic film is exposed may include one or more elements having a propensity for diffusion into exposed portions of the bulk metallic film, such as phosphorus or boron, for example. In some cases, the element included in the heated environment may be the same as one of the elements diffused into the intermediate portion of the bulk metallic film by the anneal process. In other embodiments, the element included in the heated environment may not be one of the elements diffused into the intermediate portion of the bulk metallic film by the anneal process.

Figure 5:
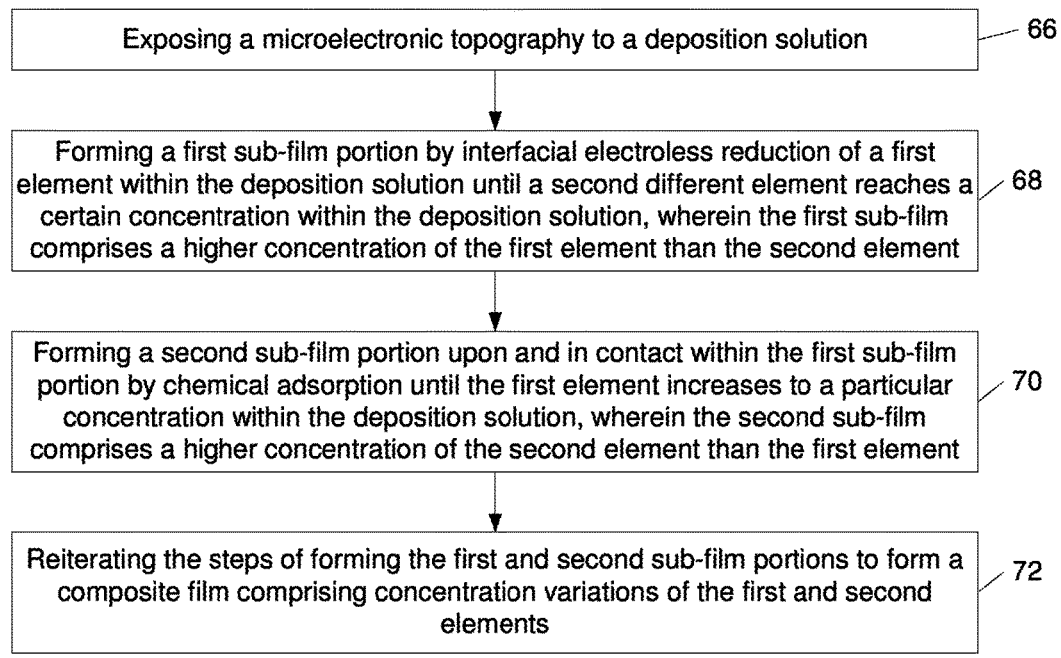
FIG. 5 depicts a flowchart of another alternative method for forming a composite metallic layer having a variation of elemental concentrations.

An alternative method for forming a barrier layer with a concentration variation of one or more elements is outlined in the flowchart shown in FIG. 5 and involves a balance of different deposition mechanisms activated during a single deposition process. The different deposition mechanisms may be induced by an additive to the deposition solution which slows the adsorption of one or more elements versus other elements in the solution. The slower adsorption rate invokes a deposition process having different mechanisms of film growth which are dependent upon the concentrations of different elements within the deposition solution. As a result, although two elements may be deposited as a mixture within a layer, the concentration of the elements throughout the layer will differ. An exemplary agent which may be used to slow the adsorption of one or more elements within an electroless plating solution may be but it not necessarily limited to pyrophosphoric acid as shown above in Table 1 for the formation of CoMoB and CoMoCrB.

The flowchart depicted in FIG. 5 includes block 66 noting the method includes exposing a microelectronic topography to a deposition solution. Such an exposure may include immersing the microelectronic topography within a bath of the deposition solution, dispensing the deposition solution upon the microelectronic topography, or a combination thereof. In addition, the method includes block 68 in which a first sub-film portion having a higher concentration of a first element than a second different element is formed by interfacial electroless reduction of the first element within the deposition solution until the second element reaches a certain concentration within the deposition solution. During such a step, the first element within the deposition solution is deposited at a faster rate than a second element by a mass-diffusion control mechanism. At the point in which the second element reaches a certain concentration within the deposition solution, the deposition mechanism may change such that the second component is deposited as a majority by a self-assembly deposition mechanism. In particular, FIG. 5 includes block 70 in which a second sub-film portion having a higher concentration of the second element than the first element is formed upon and in contact within the first sub-film portion by chemical adsorption. Such a deposition mechanism continues until the first element increases to a particular concentration within the deposition solution. In response thereto, the deposition process reverts back to the mass-diffusion control mechanism to deposit the first element as a majority within a third sub-film portion.

As shown in block 72 of FIG. 5, the deposition mechanisms may be reiterated to form a composite barrier layer having alternating regions of relatively higher concentrations of the first and second elements, respectively. The reiteration of the deposition mechanisms may be automatic by the inclusion of the aforementioned additive agent within the deposition solution and the fluctuation of elemental concentrations within the deposition solution. In this manner, the process is cyclic and is self-monitoring. It is noted that subsequent sub-film portions may have slightly different concentrations of the elements as compared to the first and second sub-film portions, but may generally follow an alternating sequence of having relatively greater concentrations of the different elements.

In general, the deposition mechanisms may be reiterated any number of times and, therefore, any number of sub-films may be formed by the technique outlined in FIG. 5. In other embodiments, process may be terminated upon the formation of the first and second sub-film portions and, therefore, block 72 may, in some embodiments, be omitted from the method. It is noted that the formation of the first and second sub-films as described in blocks 68 and 70, and any subsequent sub-films may, in some embodiments, include the termination of dispensing the deposition solution upon the microelectronic topography (if applicable) and/or the termination of rotating the substrate holder as similarly described above in regard to blocks 43a and 43b of FIG. 3. Such a sequence of steps may advantageously allow sub-films to be formed having substantially uniform elemental composition, uniform thickness, and substantially free of defects.

Barrier layer formation involving a balance of deposition mechanisms may be particularly applicable for forming barrier layers with a variation of molybdenum. In particular, molybdenum may be particularly amenable to slow adsorption rates relative to other elements in the presence of an additive agent, such as pyrophosphoric acid, for example. For instance, a barrier film including alternating regions of relatively higher concentrations of cobalt and molybdenum, respectively, may be deposited using the balanced deposition mechanism technique by having majority cobalt portions formed by interfacial electroless reduction and majority molybdenum portions formed by a chemical adsorption. In addition, molybdenum oxide may be particularly suitable for formation from a process of balanced deposition mechanisms. Other elements with molybdenum as well as other combinations of elements may also be formed as a barrier layer using the process of balanced deposition mechanisms and, therefore, the method is not necessarily limited to the fabrication of cobalt-molybdenum alloys or molybdenum oxide.

In addition or alternative to the methods described in reference to FIGS. 3-5, other methods for forming barrier layers having a variation of elemental concentrations may include controlling the process solution temperature on the substrate surface. More specifically, other methods may introduce a variation of solution temperature across a substrate to form a barrier film with a variation of elemental concentrations. Typically, the concentration of elements within an electrolessly deposited film is dependent on the temperature at which the deposition takes place. As such, introducing a variation of solution temperature across a substrate may induce a variation of elemental concentrations. One manner in which to control process solution temperature across a substrate is shown and described in reference to FIGS. 6-10. In particular, FIGS. 6-10 illustrate a flowchart outlining a method to control the flow pattern and, thus, the temperature variation of the solution across the substrate surface, systems configured to implement the method, and graphs outlining exemplary process parameters used administer the method. It is noted that the use of the methods and systems described in reference to FIGS. 6-10 are not necessarily mutually exclusive to other methods for forming barrier layers with a variation of elemental concentrations. Rather, the methods and systems may, in some embodiments, be used in combination with any of the methods described in reference to FIGS. 3-5 to form a barrier layer.

Figure 6:
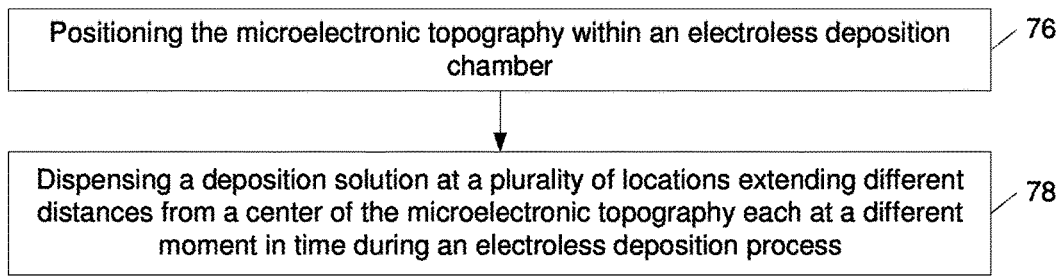
FIG. 6 depicts a flowchart of yet another alternative method for forming a composite metallic layer having a variation of elemental concentrations.

As shown in the flowchart depicted in FIG. 6, the method may include block 76 in which a microelectronic topography is positioned within an electroless plating chamber. The method further includes block 78 in which a deposition solution is dispensed at a plurality of locations extending different distances from a center of the microelectronic topography each at a different moment in time during an electroless plating process. In particular, when solution distribution in a first zone is completed, the dispensing arm of the electroless deposition chamber moves to another position (not necessarily adjacent to the first zone) and the solution is dispensed thereon. In addition to the placement of dispensing the deposition solution, the amount, rate and duration the solution is dispensed on the microelectronic topography may be controlled. Such a plurality of parameters may generally relate to the flow pattern of the solution across the wafer. Consequently, the method may include regulating a flow pattern of a solution to vary the temperature of the solution across the microelectronic topography and induce a variation of elemental concentrations within a deposited film. An exemplary system for controlling flow patterns of solutions across a substrate is described in more detail below in reference to FIGS. 7 and 8.

In addition to controlling the flow pattern of the deposition solution, the method may include altering the temperature of the dispensed solution such that different regions of the substrate are exposed to different solution temperatures. In some embodiments, the exemplary system described in reference to FIGS. 7 and 8 may be configured to dispense the solution at different temperatures across a substrate. In addition or alternatively, heating and/or cooling mechanisms within a substrate holder of the electroless plating chamber may be used to change the temperature of the deposition solution during plating. In any case, solution temperatures for electroless plating operations may generally be regulated between approximately 20° C. and approximately 120° C., or more specifically, between approximately 55° C. and approximately 90° C. Warmer or cooler solution temperatures may be used, however, depending of the fabrication specifications of the process. In some embodiments, the methods of controlling the process solution temperature and/or flow pattern across a substrate may induce a horizontal variation of elemental concentrations. In addition or alternatively, the methods may be used to induce a vertical variation of elemental concentrations. In particular, the method may include altering the flow pattern and/or temperature of the solution as the film is deposited, such that elemental concentrations within the film vary across regions of the microelectronic topography and/or vary with the thickness of the film.

Figure 7:
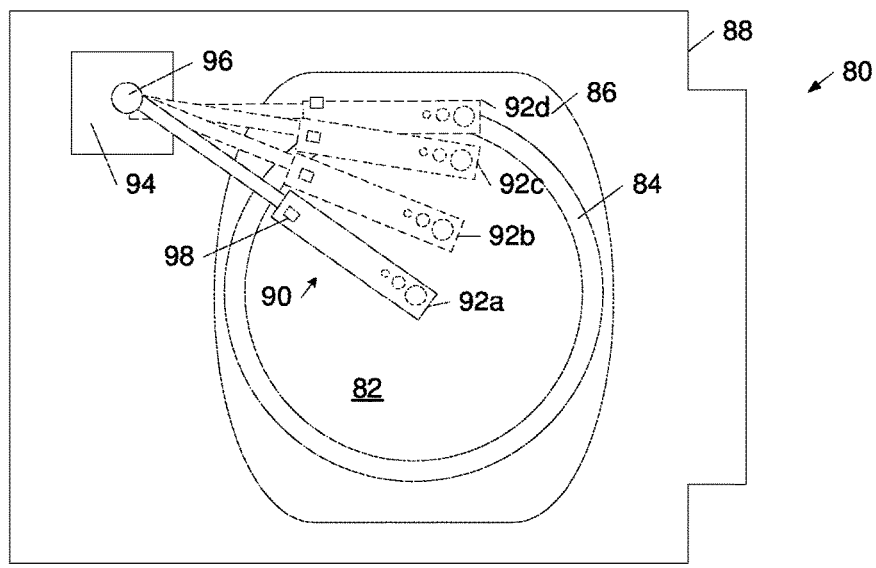
FIG. 7 depicts a plan view of an electroless plating chamber configured for the method outlined in the flowchart of FIG. 6.

Turning to FIG. 7, a top view of microelectronic topography 82 disposed within electroless plating chamber 80 is illustrated. As shown in FIG. 7, electroless plating chamber 80 includes substrate holder 84 supported by platen 86 and surrounded by chamber walls 88. The electroless plating chamber further includes dispensing arm 90 for supplying a deposition solution onto microelectronic topography 82, which resides upon substrate holder 84. The cover of electroless plating chamber 80 is not shown in order to illustrate the alternate positions of dispensing arm 90 relative to microelectronic topography 82. As shown by the dotted line outlines of dispensing arm 90 in FIG. 7, electroless plating chamber 80 may be configured to position dispensing arm 90 above a plurality of locations of microelectronic topography 82. More specifically, dispensing arm 90 may be connected to rotary drive mechanism 94 for positioning the suspended end of dispensing arm 90 among positions 92a-92d with respect to fixed axis 96.

In this manner, electroless plating chamber 80 may be configured to position dispensing arm 90 over a plurality of locations extending different distances from a center of microelectronic topography 82 each at a different moment in time during an electroless plating process. More specifically, positions of dispensing arm 90 may be controlled for delivering a deposition solution to a specific area of microelectronic topography 82. In embodiments in which substrate holder 84 is configured to rotate microelectronic topography 82 during processing, such an array of different radial positions may advantageously offer full coverage of the microelectronic topography. In particular, solution dispensed from dispense arm 90 may be distributed to cover different radial rings of microelectronic topography 82, which collectively cover the entirety of the topography. Exemplary wafer rotation speed may be between approximately 1 rpm and approximately 100 rpm and, in some embodiments, approximately 30 rpm, but faster or slower rotations speeds may be used. It is noted that the different areas of the microelectronic topography upon which the solution is dispensed by dispense arm 90 may overlap to ensure coverage of the entirety of the topography during processing, but generally the areas cover different regions of the topography and, therefore, are distinct.

Although FIG. 7 illustrates dispensing arm 90 positioned in four different locations, electroless plating chamber 80 may be configured to position dispensing arm 90 at any number of different locations greater or less than four. In some cases, positioning dispensing arm 90 in nine different positions has shown to provide sufficient coverage of a deposition solution over an entirety of a microelectronic topography, but the methods and systems described herein are not necessarily so limited. In addition, although positions 92a-92d are illustrated with respect the same radial line of microelectronic topography 82, dispense arm 90 may be positioned along different radial lines of microelectronic topography 82. Furthermore, positions 92a-92d are not restricted to being evenly spaced with respect to each other. Rather, positions 92a-92d may be spaced apart by different distances. Furthermore, dispensing arm 90 may be located at a position not overlying microelectronic topography 82 in some embodiments, as shown by position 92d in FIG. 7. Although not necessary, such a position of dispense arm 90 may be advantageous for loading microelectronic topography 82 in and out of electroless plating chamber 80. The program instructions used to regulate the distribution of solution from dispense arm 90 described in more detail below may be configured to inhibit solution flow from the dispense arm in such a position.

Figure 8:
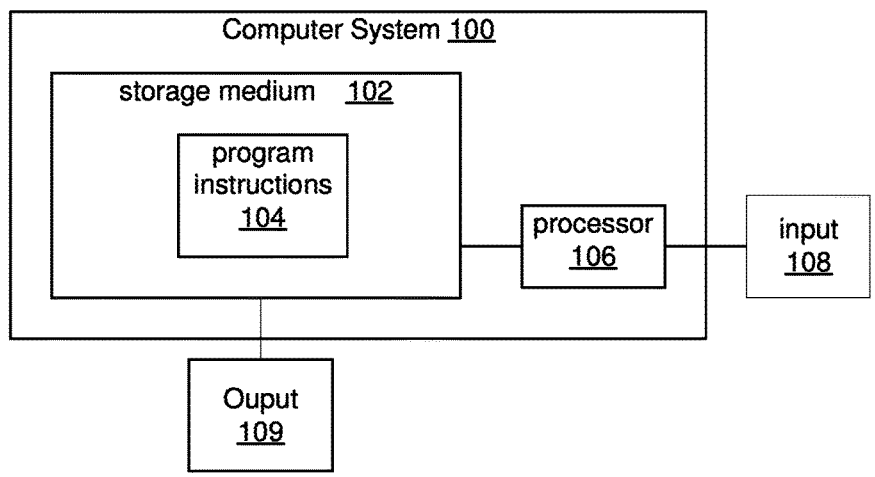
FIG. 8 depicts a schematic of a computer system which may be coupled to or incorporated within the electroless plating chamber illustrated in FIG. 8.

In some embodiments, the positioning of dispense arm 90 may be programmed through a computer system coupled to or incorporated within electroless plating chamber 80. A schematic diagram of an exemplary computer system is illustrated in FIG. 8. As shown in FIG. 8, computer system 100 includes processor 106 and storage medium 102, which in turn includes program instructions 104. The storage medium may include any device for storing program instructions, such as a read-only memory, a random access memory, a magnetic or optical disk, or a magnetic tape. In general, input 28 may be transmitted to processor 106, which may be configured to execute program instructions 104 within storage medium 102 to provide output 109 to electroless plating chamber 80. In some embodiments, program instructions 104 may be configured to exclusively regulate the position of dispense arm 90. In other embodiments, program instructions 104 may also include program instructions for regulating other facets of electroless plating chamber 80, such as but not limited to loading operations, drying operations, and pre-deposition or post-deposition cleaning operations.

As shown in FIG. 7, dispense arm 90 may, in some embodiments, include a plurality of different sized nozzles 99. In such cases, program instructions 104 may be configured to selectively dispense a deposition solution through distinct sets of the plurality of different sized nozzles with respect to plurality of positions 92a-92c. More specifically, program instructions 104 may be configured to selectively dispense a deposition solution through one or more of nozzles 99 at each of positions 92a-92c. In some embodiments, the selected nozzles may differ among all of the positions. In other embodiments, the selection of nozzles may differ for less than all of the positions. In any case, in light of the such adaptations of program instructions 104, block 78 of the method described in reference to FIG. 6 may, in some embodiments, include dispensing the deposition solution through a first nozzle above one of the plurality of locations of the microelectronic topography and may further include dispensing the deposition solution through a second different sized nozzle above another of the plurality of locations.

Since nozzles 100 are different sizes, different amounts of solution may be deposited at different locations upon microelectronic topography 82. In addition, different size areas of microelectronic topography 82 may be exposed to the deposition solution at a given time. In general, the diameters of nozzles 100 may be significantly smaller than a wafer diameter (e.g., between approximately ⅛ inch and approximately 1 inch, although other sizes may be used) such that only a portion of a wafer is exposed to deposition solution thus creating an area with high density of nucleation sites. In yet other embodiments, dispense arm 90 may not include a plurality of different sized nozzles and, therefore, such an adaptation may be omitted from the methods and systems described in reference to FIGS. 6-8.

In addition or alternative to selectively dispensing a deposition solution through different sized nozzles, program instructions 104 may be configured to vary the rate and/or duration at which a deposition solution is dispensed. In this manner, the method, system and program instructions described herein may be configured to vary the amount of solution dispensed upon microelectronic topography 82 in alternative manners than described for varying the distribution of a solution through different sized nozzles. For example, the method described above in reference to FIG. 6 may, in some embodiments, include dispensing the deposition solution at a first rate and/or duration above one the plurality of locations of the microelectronic topography and dispensing the deposition solution at a second different rate and/or duration above another of the plurality of locations of the microelectronic topography. In some embodiments, the selected rate and/or duration may differ among all of the positions. In other embodiments, the selected rate and/or duration may differ for less than all of the positions. In general, deposition solution flow rate may vary between approximately 0.5 L/min and approximately 10.0 L/min and, more specifically between approximately 2.0 L/min and approximately 3.0 L/min. Exemplary durations of flow may generally be between 10 seconds and a few minutes and more specifically between, approximately 30 seconds and approximately 60 seconds, but longer or short durations may be employed. In addition, larger or smaller flow rates may be used.

In any case, the selected rates of flow may induce laminar flow of the deposition solution in some embodiments. Laminar flow may be advantageous in some cases, since it is less likely to cause bubbles on the surface of microelectronic topography 82. The occurrence of bubbles upon a microelectronic topography during an electroless deposition process often causes undesirable random non-uniformity in deposition thickness. In other cases, however, the selected rates of flow may induce turbulent flow of the deposition solution. In some embodiments, program instructions 104 may be configured to pulse a deposition solution through dispense arm 90 and, in some cases, pulse a deposition solution at different frequencies with respect to different regions of microelectronic topography 82. Furthermore, program instructions 104 may, in some embodiments, be configured to vary the angle of the line of trajectory from dispense arm 90 such that the solution is not limited to being dispensed perpendicular to the surface of microelectronic topography 82. Varying the angle of the solution trajectory may, in some cases, be particularly advantageous for filling narrow holes within a topography.

As shown in FIG. 7, dispense arm 90 may, in some embodiments, include thermocouple 98. In such embodiments, the method, system and program instructions described in reference to FIGS. 6-8 may be configured to dispense deposition solutions at different temperatures with respect to the plurality of locations of dispense arm 90 during processing. In particular, the method described in reference to FIG. 6 may, in some embodiments, include dispensing the deposition solution upon one of the plurality of locations of the microelectronic topography at a first temperature and may further include dispensing the deposition solution upon another of the plurality of locations of the microelectronic topography at a second distinct temperature. In this manner, the method, system and program instructions described in reference to FIGS. 6-8 may introduce solution temperature variation across a microelectronic topography in some embodiments. In particular, a thin layer of the process liquid on a substrate surface generally has low thermal capacity, which allows the temperature of a solution to reduce quickly. Varying the timing at which the solution is distributed as well as varying the temperature at which the solution is dispensed relative to such time-varying distribution may allow the solution temperature across the microelectronic topography to be controlled either for a variation of temperature or temperature uniformity.

Figure 9:
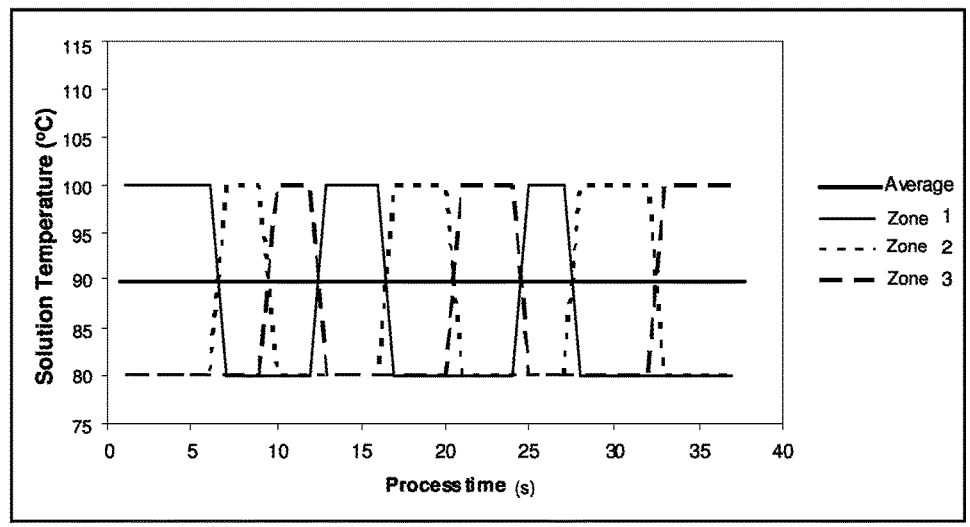
FIG. 9 depicts a plot of solution temperature versus process time for a plurality of different areas of a microelectronic topography.

It is noted that in other embodiments the configuration of the method, system and program instructions to dispense a solution at varying temperatures with respect to different regions of a microelectronic topography may aid in introducing solution temperature uniformity across the microelectronic topography. In particular, since a solution is dispensed at different locations and different times across a topography using the configurations described in reference to FIGS. 6-8, regions of the solution may evaporate at different times affecting the temperature of the solution at such regions. The use of dispense arm 90 and program instructions 104, however, may be optimized to account for such fluctuations among regions of the solution to produce solution temperature uniformity across a microelectronic topography in some embodiments. For example, FIG. 9 illustrates the temperature of a deposition solution with respect to three zones of a microelectronic topography, each respectively corresponding to positions 92a-92c of dispense arm 90. As shown in FIG. 9, the temperature of the solution varies at each of the zones due to dispensing the solution at different times with respect to the zones. In particular, while the deposition process at zone 2 is active, the temperature of the solution at zone 1 may drop according to $E*H=F*T*S$, where E=evaporation rate, H=heat of evaporation, F=solution flow rate, T=solution temperature drop per angle/cycle and S=specific heat of the solution. Collectively, however, the variations of solution temperatures across the zones produce a uniform average temperature across the microelectronic topography.

Although solution temperature uniformity may be contrary to the aforementioned objective of forming a film with a variation of elemental concentration, the method, system and program instructions described in reference to FIGS. 6-8 are not necessarily limited to forming a film with a variation of elemental concentration. In particular, the method, system and program instructions may be used to form portions or an entirety of a barrier layer without variations of elemental concentration. In yet other embodiments, one of the methods described in reference to FIGS. 3-5 may be used in combination with the method, system and program instructions described in reference to FIGS. 6-8 to induce a variation of elemental concentration with a barrier layer while incurring solution temperature uniformity across a microelectronic topography.

Consequently, program instructions 104 for positioning dispense arm 90 may be configured to provide uniform or non-uniform heat density of the deposition solution across microelectronic topography 82 by regulating dispensing times across different positions. As a result, films deposited using the method, system and program instructions described in reference to FIGS. 6-8 may be formed with a uniform thickness profile or with a varying thickness profile. As noted above, solution temperature during an electroless deposition process has a direct effect on the thickness uniformity of the resulting film. Since the method, system and program instructions discussed in reference to FIGS. 6-8 may be configured to induce variation or uniformity of solution temperature across a microelectronic topography, the method, system and program instructions may be configured to induce variation or uniformity with regard to a thickness of a film deposited by electroless deposition techniques.

Figure 10A:
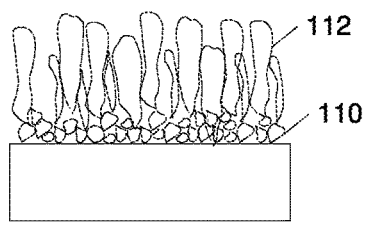
FIG. 10a depicts a partial cross-sectional view of a microelectronic topography having a film first deposited by a reaction limited mechanism of film growth and further deposited by a mass diffusion limited mechanism of film growth.
Figure 10B:
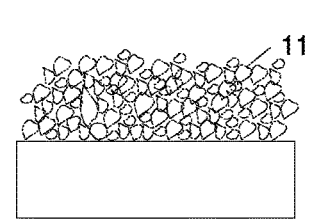
FIG. 10b depicts a partial cross-sectional view of a microelectronic topography having a film deposited exclusively by a reaction limited mechanism of film growth.
Figure 10C:
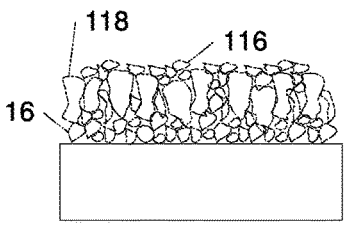
FIG. 10c depicts a partial cross-sectional view of a microelectronic topography having a film first deposited by a reaction limited mechanism of film growth, followed by a mass diffusion limited mechanism of film growth, and finally by a second reaction limited mechanism of film growth.

Regardless of whether the method, systems and program instructions described in reference to FIGS. 6-8 induce solution temperature uniformity or variation across a microelectronic topography, the temperature fluctuations among the zones may change mechanism of film growth from mass diffusion limited to reduction reaction rate limited, advantageously producing an amorphous (nanocrystalline) layer with low density of pinholes or growth defects as well as lower minimum film thickness and better surface roughness. Exemplary amorphous layers resulting from changes of film growth mechanisms during an electroless plating process are shown in FIGS. 10b and 10c and are compared to a layer shown in FIG. 10a formed from a conventional electroless plating process. In particular, FIG. 10a illustrates a partial cross-sectional view of an exemplary film deposited first by a reduction reaction rate limited mechanism of film growth (denoted by relatively small granules 110) and afterward by mass diffusion limited mechanism of film growth (denoted by relatively long and narrow upright granules 112). Such a film structure is typical of conventional electroless plating techniques in which a deposition solution is deposited continuously at one location and at a single temperature throughout the deposition process.

FIG. 10b illustrates an exemplary cross-section of a film deposited exclusively by a reduction reaction rate limited mechanism of film growth (denoted by relatively small granules 114). Such film structure may be formed in embodiments in which the temperature of the solution continuously varies during the deposition of the film. FIG. 10c illustrates an exemplary cross-section of a film deposited by mechanisms of film growth which switch between reduction reaction rate limited and mass diffusion limited (denoted by the mixture of relatively small granules 116 and relatively long and narrow upright granules 118). Such a film structure may be formed in embodiments in which the temperature of the solution varies at some periods and at other times is substantially constant.

As shown in FIGS. 10b and 10c, films formed partially or wholly by a reduction reaction rate limited mechanism of film growth include comparatively less gaps than the film formed exclusively by a mass diffusion limited mechanism of film growth depicted in FIG. 10a. As a result, a film deposited by varying the solution temperature profile and/or solution flow rate may advantageously have less pin-holes and in-film growth defects. In addition, such films may be smoother. In particular, films formed partially or wholly by a reduction reaction rate limited mechanism of film growth may have a surface roughness of approximately 0.5 nm RMS, which is significantly smoother than films having a surface roughness of approximately 2.0 RMS formed exclusively by a mass diffusion limited mechanism of film growth. Furthermore, smaller and fewer gaps within a deposited barrier layer may further aid in inhibiting diffusion of elements therethrough. More specifically, a barrier layer having smaller and fewer gaps may hinder diffusion of elements from adjacent structures, such as described in reference to FIG. 1 for the configurations of liner layer 28 and cap layer 30 adjacent to metallization structure 22. Moreover, smaller and fewer gaps may inhibit hydrogen atoms from lodging with the deposited film, reducing occurrences of hydrogen outgassing during subsequent processing which may in turn affect the formation of features overlying the film. In addition, smaller and fewer gaps allow a denser film to be formed and, as a result, a thinner film may be deposited during a given processing time as compared to films formed by conventional electroless deposition processes.

Figure 11:
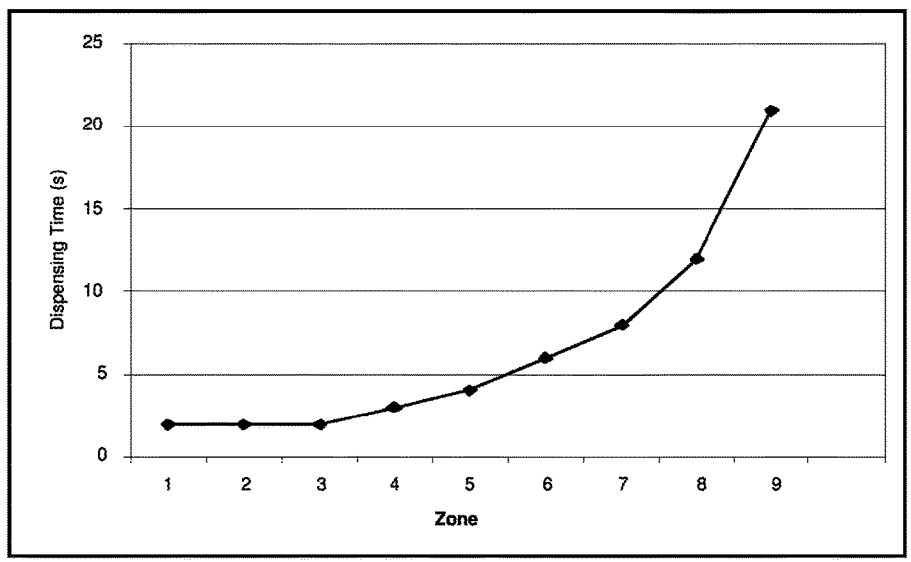
FIG. 11 depicts a plot of solution dispensing time versus a plurality of different areas of a microelectronic topography.

An exemplary set of dispensing times and sequence of positions for the distribution of a deposition solution upon a microelectronic topography is noted in Table 3. FIG. 11 illustrates a graph of the total processing time versus zone location data taken from Table 3. As shown in Table 3 and FIG. 11, an exemplary sequence of steps may extend across 9 zones of a microelectronic topography with increasingly longer dispense times programmed for Zone 1 thru Zone 9. Such a sequence and duration of dispenses may be advantageous for negating the edge effect in some embodiments, such as in cases in which Zone 1 refers to the most central zone on the microelectronic topography, Zone 9 refers to the edge most zone on the microelectronic topography, and the other zones are interposed therebetween. Films resulting from such a configuration may have substantially uniform thickness across the microelectronic topography or may have greater thicknesses near the edge of the wafer as compared to near the center of the wafer.

As shown in Table 3, the steps may, in some embodiments, be segregated into distinct sets of steps. In particular, steps 1-11 may cycle through each of the zones with a different sequence and dispensing times than steps 12-20. In this manner, a method for depositing the film may include dispensing the deposition solution in a first sequence of steps among the plurality of locations to form a first sub-film across a surface of the microelectronic topography. In addition, the method may include dispensing the deposition solution in a second different sequence of steps among the plurality of locations to form a second sub-film across the microelectronic topography and upon the first sub-film. Although the dispensing times and sequence of steps depicted in Table 3 may be advantageous for some configurations of a microelectronic topography, the dispensing times and sequence of steps may vary from those depicted in Table 3. In particular, such a display of data is merely exemplary.

TABLE 3

Sequence of Dispensing Times (in seconds) per Zone of a Microelectronic Topography for an Electroless Plating Process

| Step | Zone 1 | Zone 2 | Zone 3 | Zone 4 | Zone 5 | Zone 6 | Zone 7 | Zone 8 | Zone 9 |
|---|---|---|---|---|---|---|---|---|---|
| 1 | | | | | | | | | 8 |
| 2 | | | | | | | | 6 | |
| 3 | | | | | 3 | | | | |
| 4 | | | | 1 | | | | | |
| 5 | | | 1 | | | | | | |
| 6 | 1 | | | | | | | | |
| 7 | | | 1 | | | | | | |
| 8 | | | | | 3 | | | | |
| 9 | | | | | | | | | |
| 10 | | | | | | | 5 | | |
| 11 | | | | | | | | 8 | |
| 12 | 1 | | | | | | | | |
| 13 | | 1 | | | | | | | |
| 14 | | | 1 | | | | | | |
| 15 | | | | 2 | | | | | |
| 16 | | | | | 1 | | | | |
| 17 | | | | | | 3 | | | |
| 18 | | | | | | | 3 | | |
| 19 | | | | | | | | 6 | |
| 20 | | | | | | | | | 5 |

Figure 12:
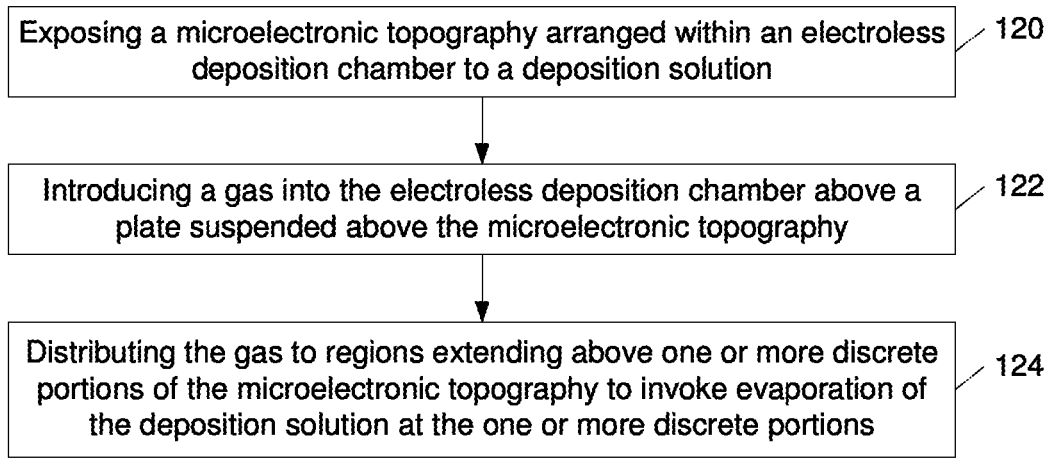
FIG. 12 depicts a flowchart of a method for depositing a film using an electroless deposition chamber.
Figure 13:
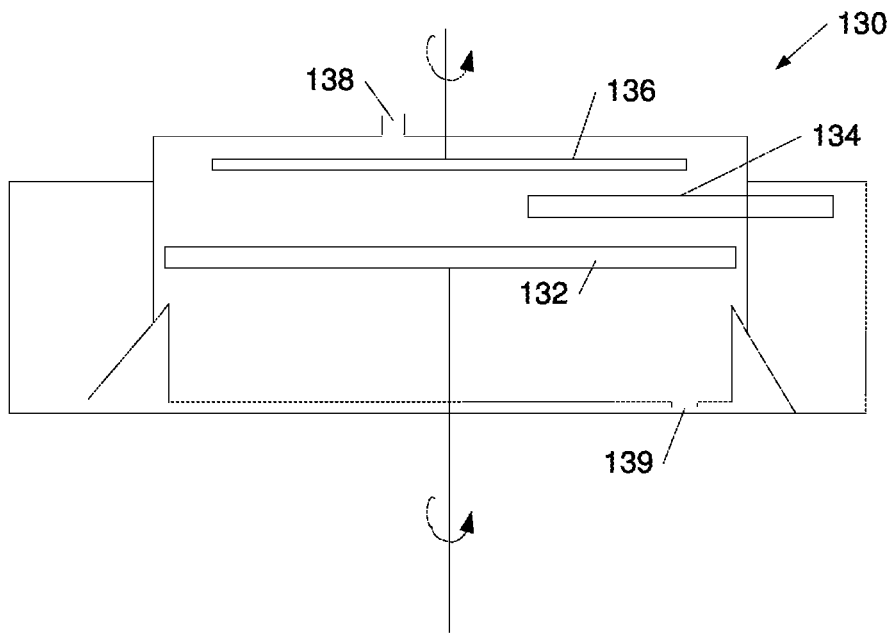
FIG. 13 depicts a cross-sectional view of an electroless plating chamber configured for the method outlined in the flowchart of FIG. 12.

An alternative method and system for controlling process solution temperature on a microelectronic topography are shown in FIGS. 12 and 13. In particular, FIG. 12 depicts a flowchart of an exemplary method and FIG. 13 illustrates an exemplary system in which a gas is distributed over a plate disposed above a substrate holder configured for supporting a microelectronic topography. As will be described in more detail below, the method and system allows portions of a deposition solution in select regions of the microelectronic topography to evaporate (i.e., remove water from the deposition solution) a faster rate than other regions, inducing solution temperature uniformity or variation across the topography. In general, removing water from an electroless plating solution will lower the temperature of the solution. In cases in which a solution temperature variation is induced, the evaporation of the solution during processing may produce a horizontal variation of elemental concentrations and, in some cases, a vertical variation of elemental concentrations as well. In addition or alternative to evaporating select regions of the microelectronic topography, the gas may be configured react with the surface of the microelectronic topography such that contaminants (i.e., debris and/or oxidized metal) may be removed from the surface topography. Furthermore, the gas may be additionally or alternatively configured to regulate concentrations of other gases within the electroless plating chamber.

As shown in block 120 of FIG. 12, the method may include exposing a microelectronic topography arranged within an electroless plating chamber to a deposition solution. Such an exposure may include immersing the microelectronic topography within a bath of the deposition solution, dispensing the deposition solution upon the microelectronic topography, or a combination thereof. An exemplary configuration of an electroless plating chamber which may be used for the method depicted in FIG. 12 is illustrated in FIG. 13. In particular, electroless plating chamber 130 includes substrate holder 132 upon which a microelectronic topography may be supported. Suspended above substrate holder 132 is dispense arm 134 and plate 136. In some embodiments, dispense arm 134 may include the configurations described in reference to FIGS. 6-8 and, therefore, may be moveable to multiple positions above substrate holder 132. In other embodiments, however, dispense arm 134 may be fixed. As such, the configurations of electroless plating chamber 130 of FIG. 13 and electroless plating chamber 80 of FIG. 7 may be combined or may be mutually exclusive. In alternative embodiments, the method described in FIG. 12 may be used with an electroless plating chamber having a shower head for dispensing a deposition solution. In other embodiments, the method may be used with an electroless plating chamber which does not include a solution dispense arm or shower head, but rather is configured such that a microelectronic topography may be immersed within a deposition solution.

In any case, the deposition method may include block 122 as shown in FIG. 12 in which a gas is introduced into the electroless deposition chamber above a plate suspended above the microelectronic topography. Such a step may be performed within electroless plating chamber 130 by introducing a gas into gas inlet 138 above plate 136. In some embodiments, electroless plating chamber 130 may further include outlet 139 by which to remove the deposition solution and byproduct gases as shown in FIG. 13. In some cases, the gas introduced into electroless plating chamber 130 may include nitrogen and, in some cases, may be specifically the diatomic form of nitrogen (i.e., $N_2$). Such a gas may be particularly applicable for increasing the evaporation rage of the deposition. Other gases which may be applicable for increasing the evaporation rate of the deposition solution, however, may also or alternatively be used. In some embodiments, the gas may be configured to be reactive with the surface of the microelectronic topography such that contaminants (i.e., debris and/or oxidized metal) may be removed from the surface topography. For instance, hydrogen gas or a fluorinated carbon gas at a substantially high temperature, such as greater than 450° C., for example, may be introduced into the chamber to react with the surface of the microelectronic topography. Furthermore, the gas may be additionally or alternatively configured to regulate concentrations of other gases within the electroless plating chamber.

It is noted that the sequence of steps associated with blocks 120 and 122 is not necessarily limited to the order shown in FIG. 12. In particular, the step of introducing a gas into the electroless plating chamber may sometimes be initiated subsequent to the step of exposing the microelectronic topography to a deposition solution, but the method is not necessarily so restricted. In some case, the step of introducing a gas into the electroless plating chamber may alternatively be initiated prior to the step of exposing the microelectronic topography to a deposition solution. In other cases, the step of introducing a gas into the electroless plating chamber may be initiated at substantially the same time as the step of exposing the microelectronic topography to a deposition solution.

In any case, the method in FIG. 12 continues to block 124 in which the gas is distributed to regions extending above one or more discrete portions of the microelectronic topography. In some embodiments, the distribution of the gas to such regions may be used to invoke evaporation of the deposition solution at the one or more discrete portions of the microelectronic topography. For instance, the one or more discrete portions may include the peripheral edge of the microelectronic topography. In particular, gas introduced above plate 136 may be directed to the outer edges of plate 136 down to the peripheral edges of the microelectronic topography. Such a route for the gas may be particularly advantageous for negating the edge effect in some embodiments. Films resulting from such a route may have substantially uniform thickness across the microelectronic topography or may have greater thicknesses near the edge of the wafer as compared to near the center of the wafer.

In some cases, plate 136 may be a disc having a diameter slightly smaller than the microelectronic topography being processed. For example, plate 136 may have a diameter between approximately 150 mm and approximately 190 mm for processing 200 mm microelectronic wafers. Alternatively, plate 136 may have a diameter between approximately 250 mm and approximately 290 mm for processing 300 mm microelectronic wafers. Discs of larger or smaller diameters, however, may be used for either sized wafer, depending on the fabrication specifications of the ensuing device. In some cases, plate 136 may not be a disc and, thus, may be alternatively formed of a different shape including but not limited to a square or a rectangle. Regardless of its shape, plate 136 may, in some embodiments, include holes such that portions in addition or alternative to the peripheral edges of a microelectronic topography may be exposed to the gas and, thus, have portions of a deposition solution thereon evaporate at a faster rate than other portions of the topography. The holes may be of any size and shape necessary for exposing a desired area of the microelectronic topography to the gas introduced through gas inlet 138.

In some embodiments, the process of distributing the gas to regions of the microelectronic topography may include rotating plate 136. Such rotation may advantageously direct gas to the edge and/or openings within plate 136 down to the microelectronic topography. In some embodiments, plate 136 may be rotated in the same direction as substrate holder 132 as shown in FIG. 13. In other embodiments, plate 136 may be rotated in the opposite direction as substrate holder 132. In either case, substrate holder 132 and plate 136 may be independently configured to rotate clockwise and/or counterclockwise. An exemplary range of rotation speed for plate 136 may be between approximately 100 rpm and approximately 500 rpm, although faster or slower rates may be employed. In some embodiments, plate 136 and substrate holder 132 may be rotated at the same speed. In other embodiments, however, plate 136 and substrate holder 132 may be rotated at different speeds. In either of such cases, the rate of rotation of plate 136 may, in some embodiments, be optimized with respect to wafer rotation speed and solution flow rate in order to induce solution temperature variation or uniformity across the microelectronic topography.

Figure 14:
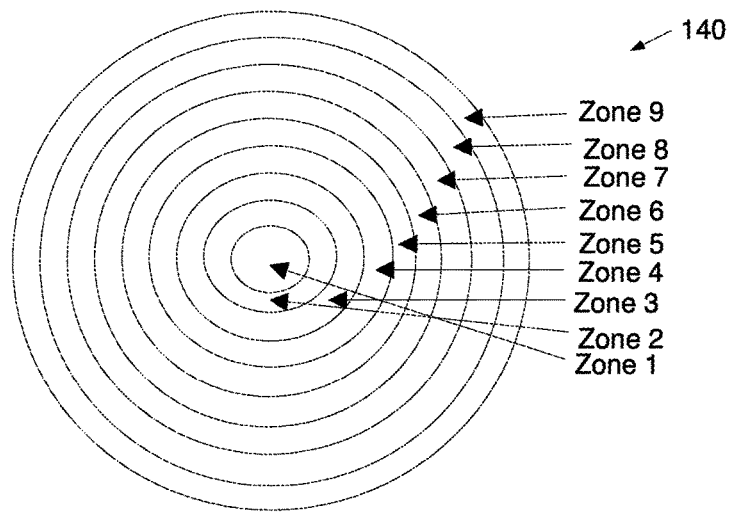
FIG. 14 depicts a plan view of an exemplary test wafer having distinct regions each including comparatively different thicknesses and comparatively different elemental concentrations.

A plan view of a test wafer having a film with regions of different elemental concentrations and thicknesses is shown in FIG. 14. In particular, a plan view of test wafer 140 is illustrated with multiple zones of different material thicknesses and elemental concentrations deposited using any of the methods and systems described above in reference to FIGS. 3-13. More specifically, FIG. 14 illustrates test wafer 140 with an electrolessly deposited film including annulus areas (denoted as zones 1-9), each having comparatively different thicknesses and comparatively different elemental concentrations. Zones 1-9 are generally formed separately and in any order. In some embodiments, zones 1-9 may be formed by deposition of the annulus close to wafer edge, followed by deposition of a layer of another thickness within an adjacent annulus closer to wafer center, and so on. Although FIG. 14 illustrates test wafer 140 having nine zones, the test wafer is not necessarily so limited. In particular, test wafer 140 may include any plurality of zones. In addition, test wafer 140 is not limited to having zones 1-9 of substantially similar widths. As such, in some embodiments, zones 1-9 may be formed with different widths.

Figure 15A:
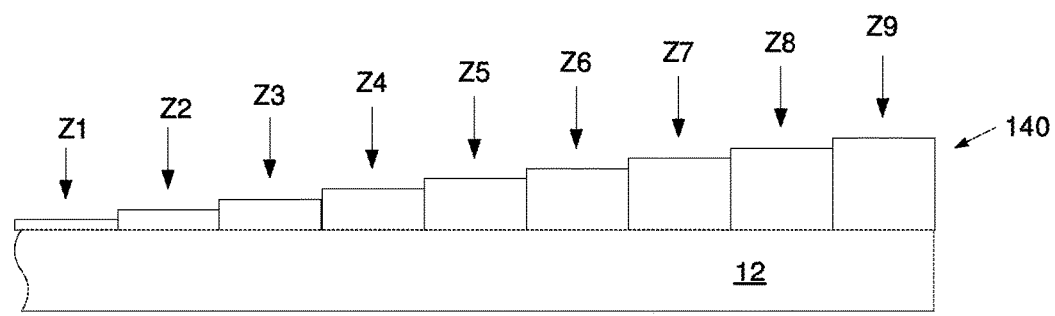
FIG. 15a depicts a partial cross-sectional view of the test wafer illustrated in FIG. 14.
Figure 15B:
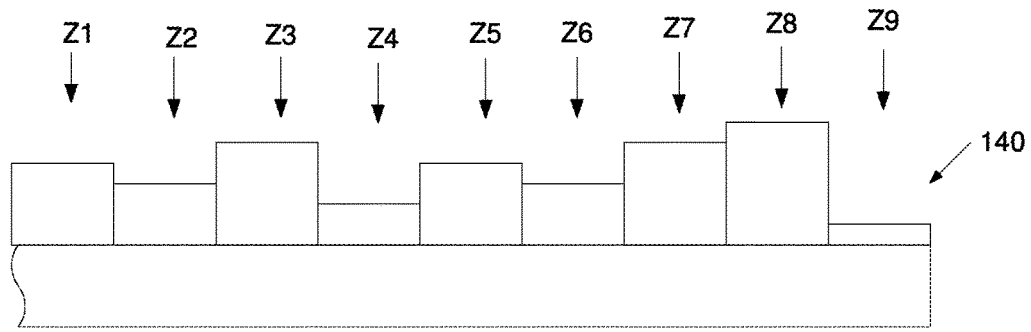
FIG. 15b depicts an alternative partial cross-sectional view of the test wafer illustrated in FIG. 14.

In some embodiments, zones 1-9 may be configured incrementally with respect to their thicknesses as shown in the exemplary partial cross-sectional view of test wafer 140 in FIG. 15a. In particular, zone 1 may be configured to have the thinnest profile, zone 9 may include the thickest profile, and zones 2-8 may include incremental thicknesses therebetween. Exemplary thicknesses for the zones may be approximately 100 nm at zone 9 of, approximately 30 nm at zone 1, thicknesses ranging from approximately 35 nm to approximately 95 nm at zones 2-8. Larger or smaller thicknesses, however, may be employed for any or all of zones 1-9, depending on the design specifications of the ensuing device. As shown in another exemplary cross-sectional profile of test wafer 140 in FIG. 15b, the thickness of zones 1-9 may not vary incrementally in some embodiments. Such a pattern layout is feasible since each zone is formed separately and the thickness of each region is dependent on the selective distribution of the deposition solution. In such cases, the thicknesses of zones 1-9 may vary between approximately 30 nm and approximately 100 nm, but larger or smaller thicknesses may be employed. Due to the methods and systems described herein, variations of elemental concentrations may be incorporated into zones 1-9.

Similar to the variations of thicknesses, the variation of elemental concentration may vary incrementally through zones 1-9 or may vary randomly. Furthermore, the variation of elemental concentration may be independent of the incremental alignment or randomness of thicknesses within the zones. As such, zones 1-9 in either of the configurations of test wafer 140 illustrated in FIGS. 15a and 15b may include a random variation of elemental concentrations, an incrementally increasing concentration of elements or an incrementally decreasing concentration of elements. In any case, test wafer 140 may generally be used for calibration of thin film metrology equipment such as acoustic wave, X-ray fluorescence, sheet resistance, RBS, and such. Conventional metrology calibrations typically utilize multiple test wafers. A plurality of calibration wafers, however, is often costly due to the costs for both the wafers themselves and for lost production time on manufacturing tools due to qualification and calibration downtime. A single calibration wafer, such as test wafer 140, will allow significant cost advantages.

It will be appreciated to those skilled in the art having the benefit of this disclosure that this invention is believed to provide a system and methods involving electroless plating processes for the formation of metallic layers and structures within microelectronic topographies. Further modifications and alternative embodiments of various aspects of the invention will be apparent to those skilled in the art in view of this description. For example, although the process chambers and methods provided herein are frequently described in reference to the deposition of barrier layers, the system and methods are not necessarily restricted to such operations. In particular, the methods and systems described herein may be used for the deposition of other types of layers and as well as other operations such as but not limited to cleaning and drying operations. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. An electroless plating chamber, comprising:
   a substrate holder;
   a plate suspended above the substrate holder, the plate having a plurality of through-holes formed therein;
   a rotatable plate and a rotatable substrate holder, the plate and the substrate holder arranged to rotate independent from each other;
   a gas inlet arranged above the plate, wherein the plate is configured to distribute gas dispensed from the gas inlet to one or more discrete regions above the substrate holder; and
   a solution inlet arranged below the plate for introducing an electroless plating solution into the electroless plating chamber;
   wherein rotation of the plate serves to direct the gas from the gas inlet to the edge of the plate and to distribute the gas through the plurality of through-holes formed in the plate.

2. The electroless plating chamber of claim 1, further comprising a storage medium comprising program instructions executable by a processor for introducing a gas into the electroless plating chamber via the gas inlet prior to introducing an electroless plating solution into the electroless plating chamber via the solution inlet.

3. The electroless plating chamber of claim 1, further comprising a storage medium comprising program instructions executable by a processor for introducing a gas into the electroless plating chamber via the gas inlet at substantially the same time as introducing an electroless plating solution into the electroless plating chamber via the solution inlet.

4. The electroless plating chamber of claim 1, further comprising a storage medium comprising program instructions executable by a processor for introducing a gas into the electroless plating chamber via the gas inlet subsequent to introducing an electroless plating solution into the electroless plating chamber via the solution inlet.

5. The electroless plating chamber of claim 1 wherein the substrate holder and plate can rotate in different directions and at different speeds relative to each other.

6. The electroless plating chamber of claim 1, wherein the plate is not a disc but is alternatively formed in different shapes.

7. The electroless plating chamber of claim 6, wherein the different shapes include a square or a rectangle.

8. The electroless plating chamber of claim 1, wherein the plate is a disc.

9. The electroless plating chamber of claim 8, wherein the disc has a diameter substantially the same or larger than a diameter of a semiconductor wafer for which the electroless plating chamber is configured to process.

10. The electroless plating chamber of claim 8, wherein the disc has a diameter substantially the same or smaller than a diameter of a semiconductor wafer for which the electroless plating chamber is configured to process.

* * * * *